US012677512B2

(12) United States Patent (10) Patent No.: US 12,677,512 B2
Nagamoto (45) Date of Patent: Jul. 7, 2026

(54) LIGHT-EMITTING DEVICE AND METHOD OF MANUFACTURING LIGHT-EMITTING DEVICE

(71) Applicant: NICHIA CORPORATION, Anan (JP)

(72) Inventor: Takuya Nagamoto, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 775 days.

(21) Appl. No.: 18/067,471

(22) Filed: Dec. 16, 2022

(65) Prior Publication Data

US 2023/0207748 A1      Jun. 29, 2023

(30) Foreign Application Priority Data

Dec. 24, 2021    (JP) ................................. 2021-210994

(51) Int. Cl.
H10H 20/853          (2025.01)
H10H 20/01          (2025.01)
(Continued)

(52) U.S. Cl.
CPC ...... H10H 20/853 (2025.01); H10H 20/0361 (2025.01); H10H 20/0362 (2025.01); H10H 20/0363 (2025.01); H10H 20/0364 (2025.01); H10H 20/851 (2025.01); H10H 20/854 (2025.01); H10H 20/855 (2025.01); H10H 20/856 (2025.01); H10H 20/857 (2025.01);
(Continued)

(58) Field of Classification Search
CPC ...... H10H 20/0361–0363; H10H 20/852–856; H10H 20/0364; H10H 20/857
See application file for complete search history.

(56) References Cited

U.S. PATENT DOCUMENTS

2010/0244662 A1*  9/2010  Uemoto ............. H10H 20/8511
                                                                313/501
2011/0309388 A1* 12/2011  Ito ........................ H10H 20/856
                                                                257/89
(Continued)

FOREIGN PATENT DOCUMENTS

JP        2010-219324 A      9/2010
JP        2012-004303 A      1/2012
(Continued)

*Primary Examiner* — Eliseo Ramos Feliciano
*Assistant Examiner* — Adam Joseph Mott
(74) *Attorney, Agent, or Firm* — Foley & Lardner LLP

(57)                ABSTRACT

A light-emitting device includes: a light-emitting element having a first surface serving as a light extracting surface, a second surface located on a side opposite the first surface, and a lateral surface connecting the first surface and the second surface, wherein the light-emitting element includes an element electrode located at the second surface; a substrate comprising a wiring electrically connected to the element electrode; a metal post located between the element electrode and the wiring; a transmissive member configured to allow light from the light-emitting element to pass therethrough; and an adhesive resin located between the first surface of the light-emitting element and the transmissive member. A portion of the adhesive resin is located on the lateral surface of the light-emitting element and on a peripheral edge of the second surface of the light-emitting element.

16 Claims, 16 Drawing Sheets

(51) Int. Cl.

| | |
|---|---|
| *H10H 20/851* | (2025.01) |
| *H10H 20/854* | (2025.01) |
| *H10H 20/855* | (2025.01) |
| *H10H 20/856* | (2025.01) |
| *H10H 20/857* | (2025.01) |
| *H10W 72/20* | (2026.01) |
| *H10W 72/30* | (2026.01) |
| *H10H 20/858* | (2025.01) |
| *H10W 40/00* | (2026.01) |
| *H10W 40/20* | (2026.01) |

(52) U.S. Cl.

CPC ......... *H10W 72/20* (2026.01); *H10W 72/334* (2026.01); *H10W 72/342* (2026.01); *H10H 20/0365* (2025.01); *H10H 20/858* (2025.01); *H10W 40/03* (2026.01); *H10W 40/20* (2026.01); *H10W 72/354* (2026.01); *H10W 72/365* (2026.01)

(56) References Cited

U.S. PATENT DOCUMENTS

| | | | |
|---|---|---|---|
| 2013/0033169 A1* | 2/2013 | Ito | H10H 20/8514 |
| | | | 445/58 |
| 2016/0351620 A1 | 12/2016 | Tanaka | |

| | | | |
|---|---|---|---|
| 2017/0033267 A1* | 2/2017 | Tamaki | H10H 20/841 |
| 2017/0092825 A1* | 3/2017 | Bando | H10H 20/8515 |
| 2017/0263824 A1 | 9/2017 | Hashimoto | |
| 2018/0040786 A1 | 2/2018 | Chen | |
| 2018/0175265 A1* | 6/2018 | Kim | H10H 20/856 |
| 2018/0244986 A1 | 8/2018 | Yanagihara et al. | |
| 2018/0331263 A1* | 11/2018 | Ikeda | H10H 20/853 |
| 2019/0165224 A1* | 5/2019 | Tokunaga | H10H 20/8514 |
| 2020/0044115 A1 | 2/2020 | Hashimoto et al. | |
| 2020/0335673 A1* | 10/2020 | Kim | H10H 20/856 |

FOREIGN PATENT DOCUMENTS

| | | | |
|---|---|---|---|
| JP | 2012-079840 A | | 4/2012 |
| JP | 2012-227470 A | | 11/2012 |
| JP | 2013012545 A | * | 1/2013 |
| JP | 2016-139564 A | | 8/2016 |
| JP | 2016-219675 A | | 12/2016 |
| JP | 2017-168494 A | | 9/2017 |
| JP | 2018-019091 A | | 2/2018 |
| JP | 2018-056552 A | | 4/2018 |
| JP | 2018-172628 A | | 11/2018 |
| JP | 2018-195800 A | | 12/2018 |
| JP | 2019-096842 A | | 6/2019 |
| JP | 2020-021823 A | | 2/2020 |

* cited by examiner

30

7 } 5
6

8A1

8
S1

8A2
8a
8b
8c 2
4
3
1
9a, 9
10c, 10E

VIIIC

VIIIC

21

20

10c1

10c, 10E

8b

8c

LIGHT-EMITTING DEVICE AND METHOD OF MANUFACTURING LIGHT-EMITTING DEVICE

CROSS-REFERENCE TO RELATED APPLICATIONS

The present application claims priority under 35 U.S.C. § 119 to Japanese Patent Application No. 2021-210994, filed Dec. 24, 2021, the contents of which are hereby incorporated by reference in their entirety.

BACKGROUND

The disclosure relates to a light-emitting device and a method for manufacturing the light-emitting device.

A light-emitting device is known in which a wavelength conversion layer is mounted on an upper surface of a light-emitting element. For example, a known method for manufacturing such a light-emitting device is described in Japanese Patent Publication No. 2012-004303, the method including: disposing, on an upper surface of a light-emitting element, a transparent material that has not yet been cured; mounting a plate-shaped optical layer on the transparent material; overlaying the light-emitting element and the plate-shaped optical layer with each other; and then, forming a fillet that is in contact with a lateral surface of the light-emitting element to cure the transparent material.

SUMMARY

According to one embodiment of the present disclosure, a light-emitting device includes: a light-emitting element including a first surface serving as a light extracting surface, a second surface disposed on an opposite side from the first surface, a lateral surface connecting the first surface and the second surface, and an element electrode provided on the second surface; a substrate including a wiring electrically connected to the element electrode; a metal post disposed between the element electrode and the wiring; a transmissive member that allows light from the light-emitting element to pass through; and an adhesive resin disposed between the first surface of the light-emitting element and the transmissive member. A portion of the adhesive resin is disposed on the lateral surface of the light-emitting element and on a peripheral edge of the second surface of the light-emitting element.

According to another embodiment of the present disclosure, a method of manufacturing a light-emitting device includes: preparing a light-emitting element mounted substrate by preparing a light-emitting element including a first surface serving as a light extracting surface, a second surface disposed on an opposite side from the first surface, a lateral surface connecting the first surface and the second surface, and an element electrode disposed on the second surface, and preparing a substrate, the light-emitting element mounted substrate having the element electrode and the substrate electrically joined through a metal post; mounting an adhesive resin on the first surface serving as the light extracting surface of the light-emitting element; mounting a transmissive member on the adhesive resin; and mounting a light reflective member that directly or indirectly covers the substrate and the light-emitting element. In the step of mounting the transmissive member, the adhesive resin is mounted on a portion between the first surface of the light-emitting element and the transmissive member, the lateral surface of the light-emitting element, and a peripheral edge of the second surface of the light-emitting element.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION

Embodiment

Figure 1:
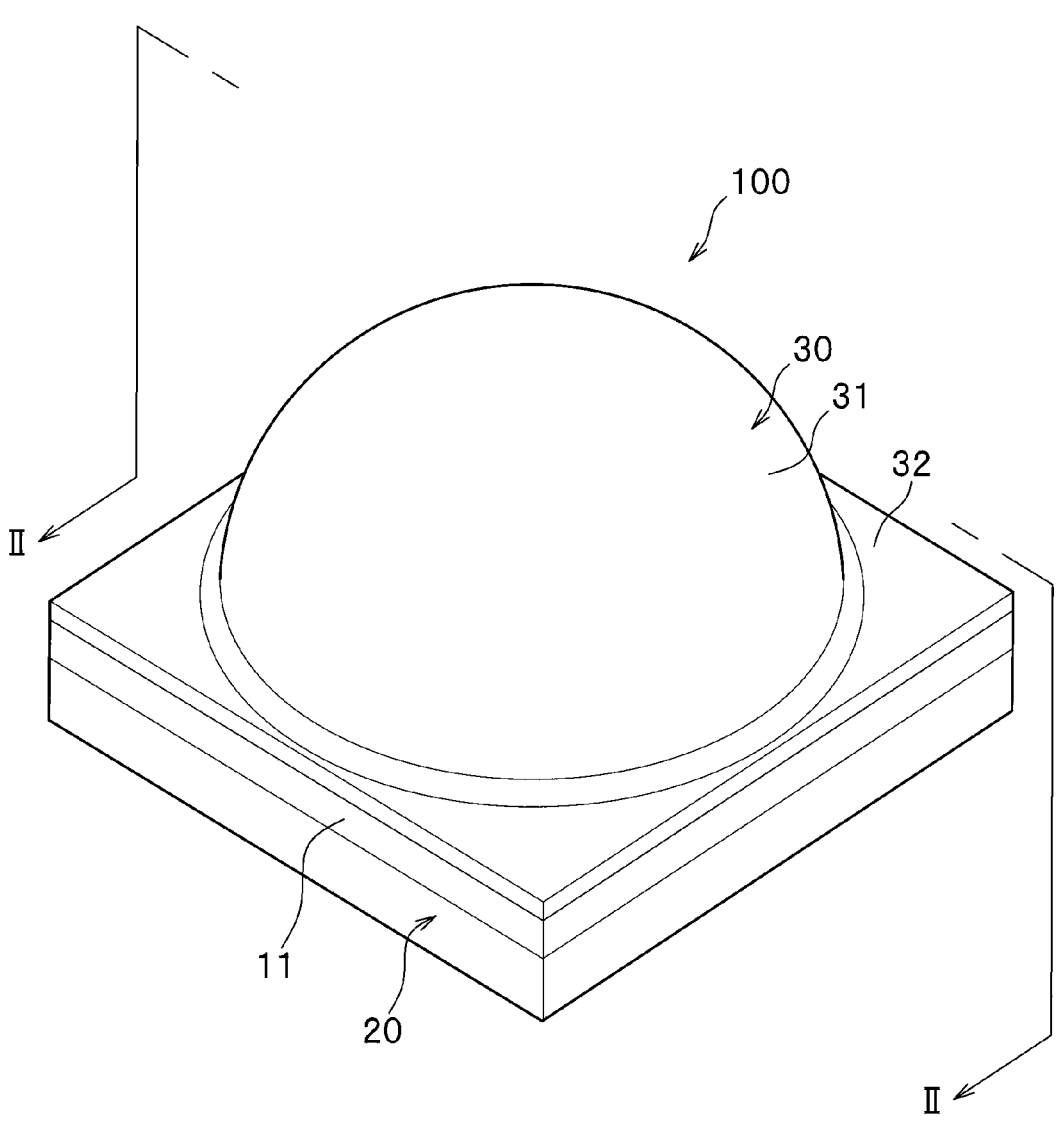
FIG. 1 is a perspective view schematically illustrating an entire light-emitting device according to a first embodiment.

Certain embodiments of a light-emitting device and a method for manufacturing the light-emitting device will be described with reference to the drawings. However, embodiments described below are provided for illustrating the light-emitting device and the method for manufacturing a light-emitting device that embody the technical ideas of the present disclosure, and thus do not limit the present disclosure. In addition, dimensions, materials, shapes, relative arrangements, or the like of components described in the present disclosure are not intended to limit the scope of the present invention thereto, unless otherwise specified, and are given for illustrative purposes only. Note that size, positional relationship, and the like of members illustrated in the drawings can be exaggerated or simplified for clarity of description. Furthermore, the wording "cover" not only includes a case of being directly in contact but also includes a case of being covered indirectly through other members, for example.

First Embodiment

Light-Emitting Device

Figure 2:
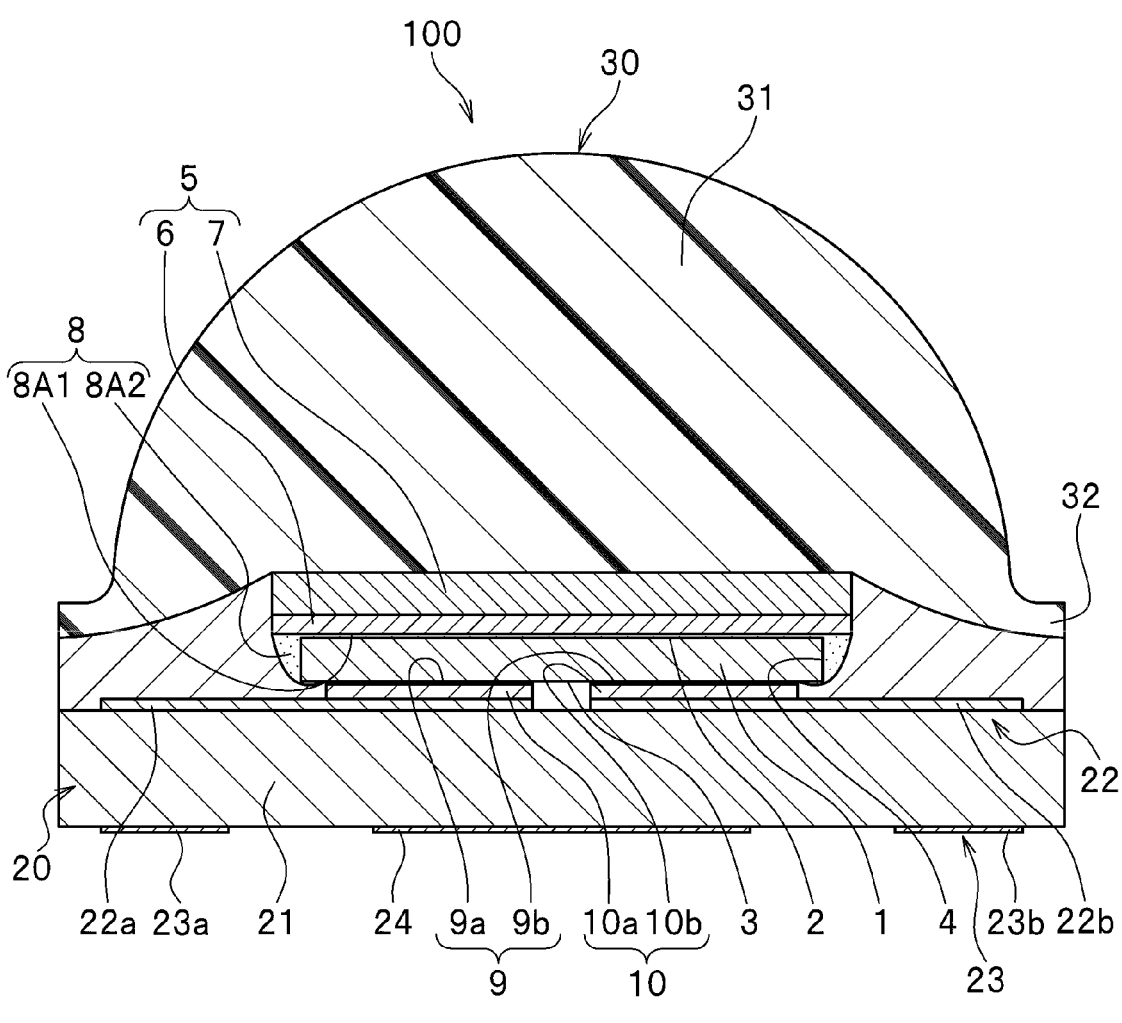
FIG. 2 is a cross-sectional view taken along line II-II in FIG. 1.
Figure 3:
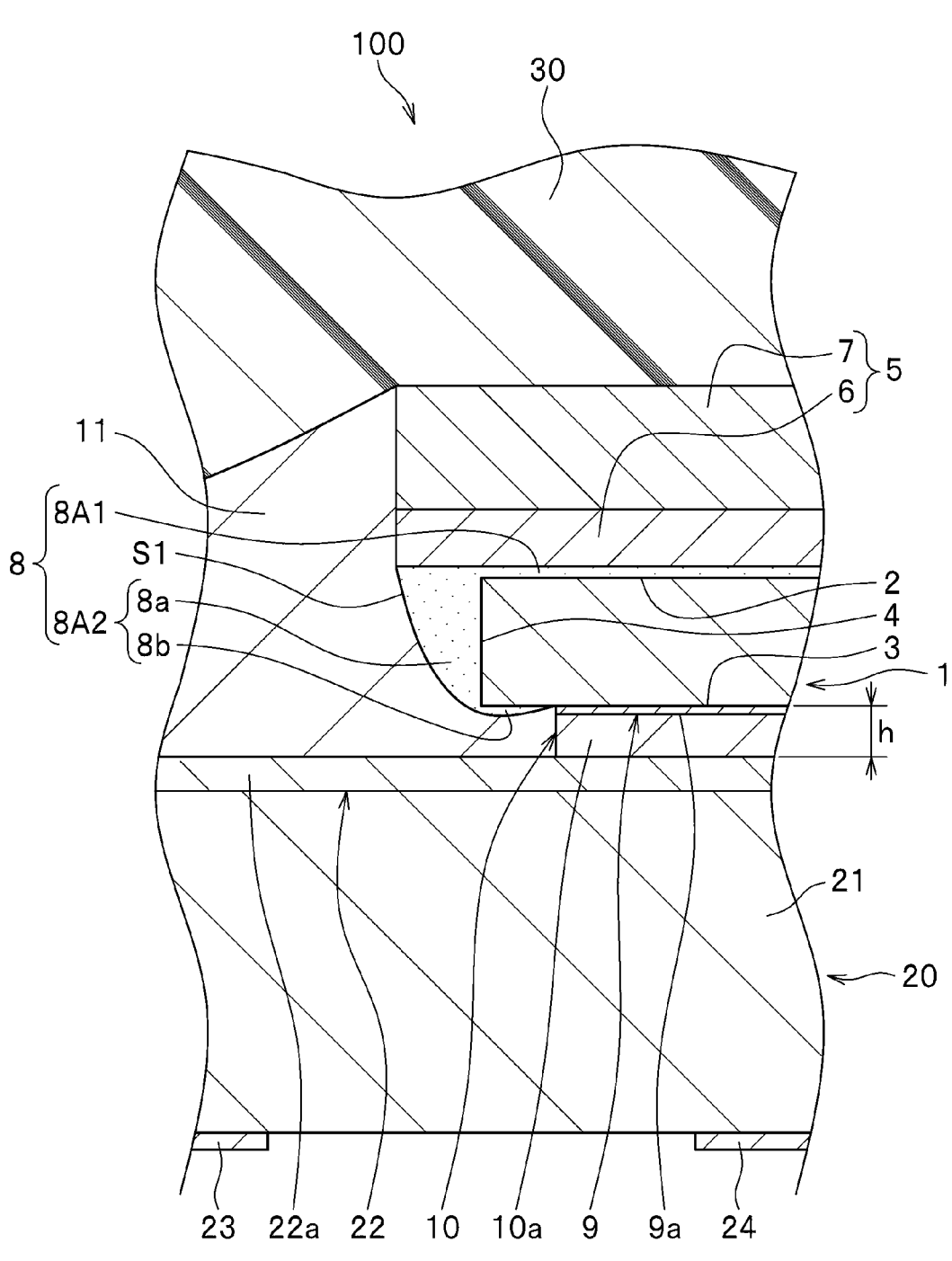
FIG. 3 is a cross-sectional view schematically illustrating a state of a fillet in which a portion illustrated in FIG. 2 is enlarged.
Figure 4:
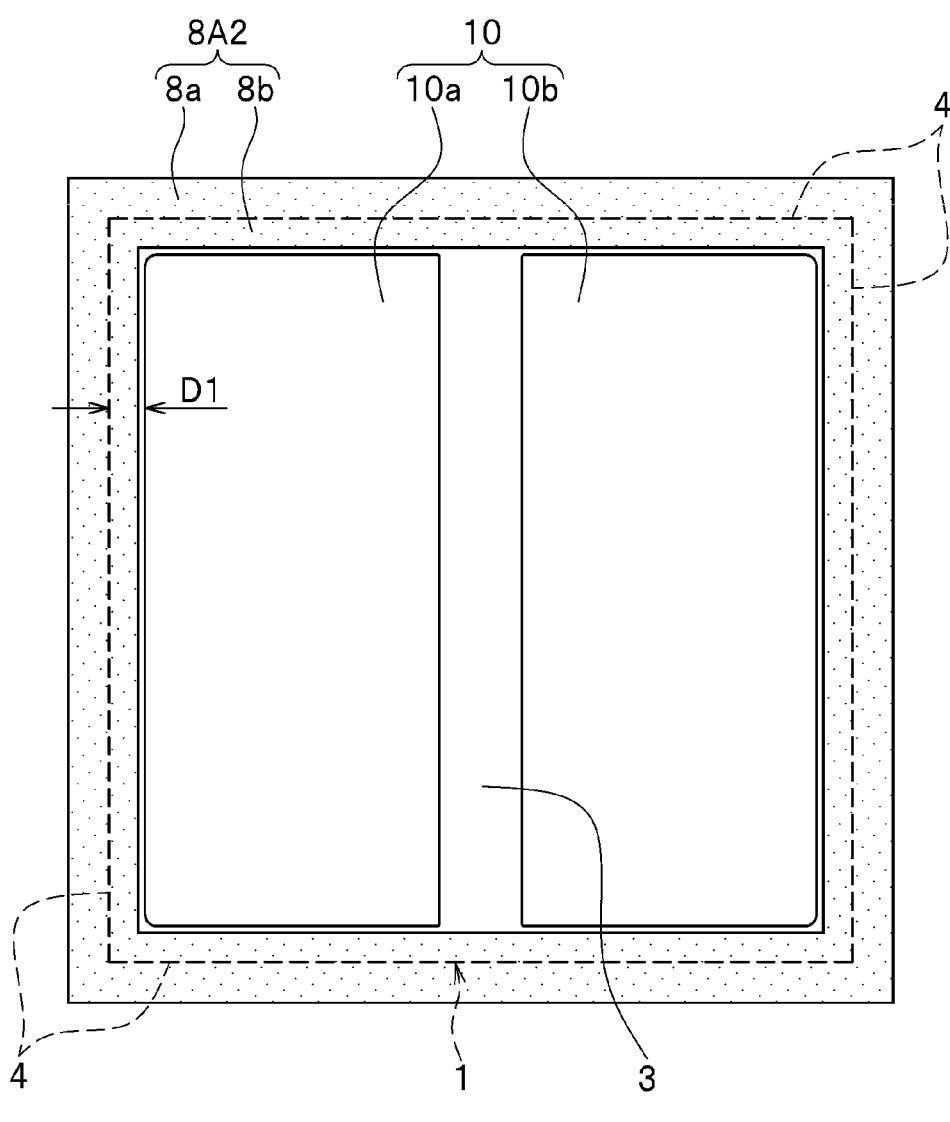
FIG. 4 is a schematic view schematically illustrating a positional relationship between a fillet and a metal post in the light-emitting device according to the first embodiment.
Figure 5A:
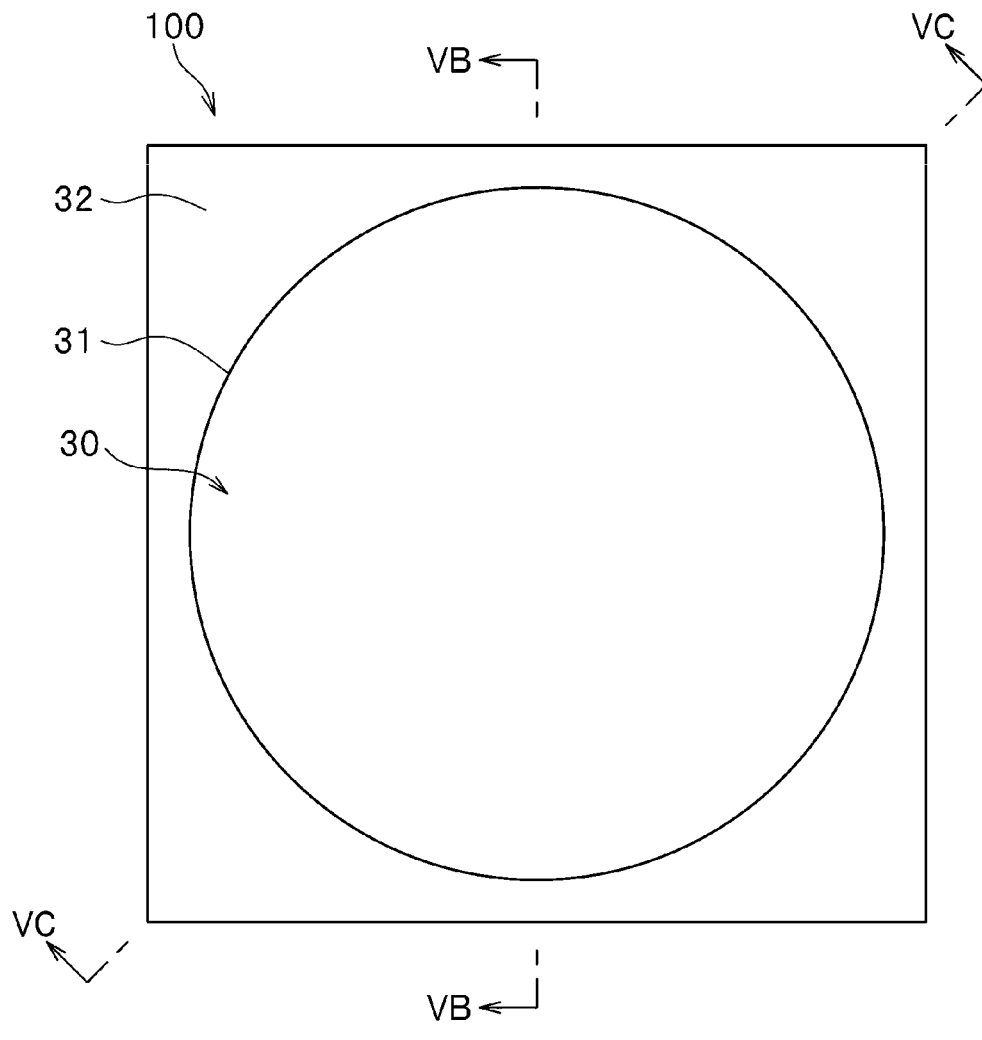
FIG. 5A is a plan view schematically illustrating the light-emitting device according to the first embodiment.
Figure 5B:
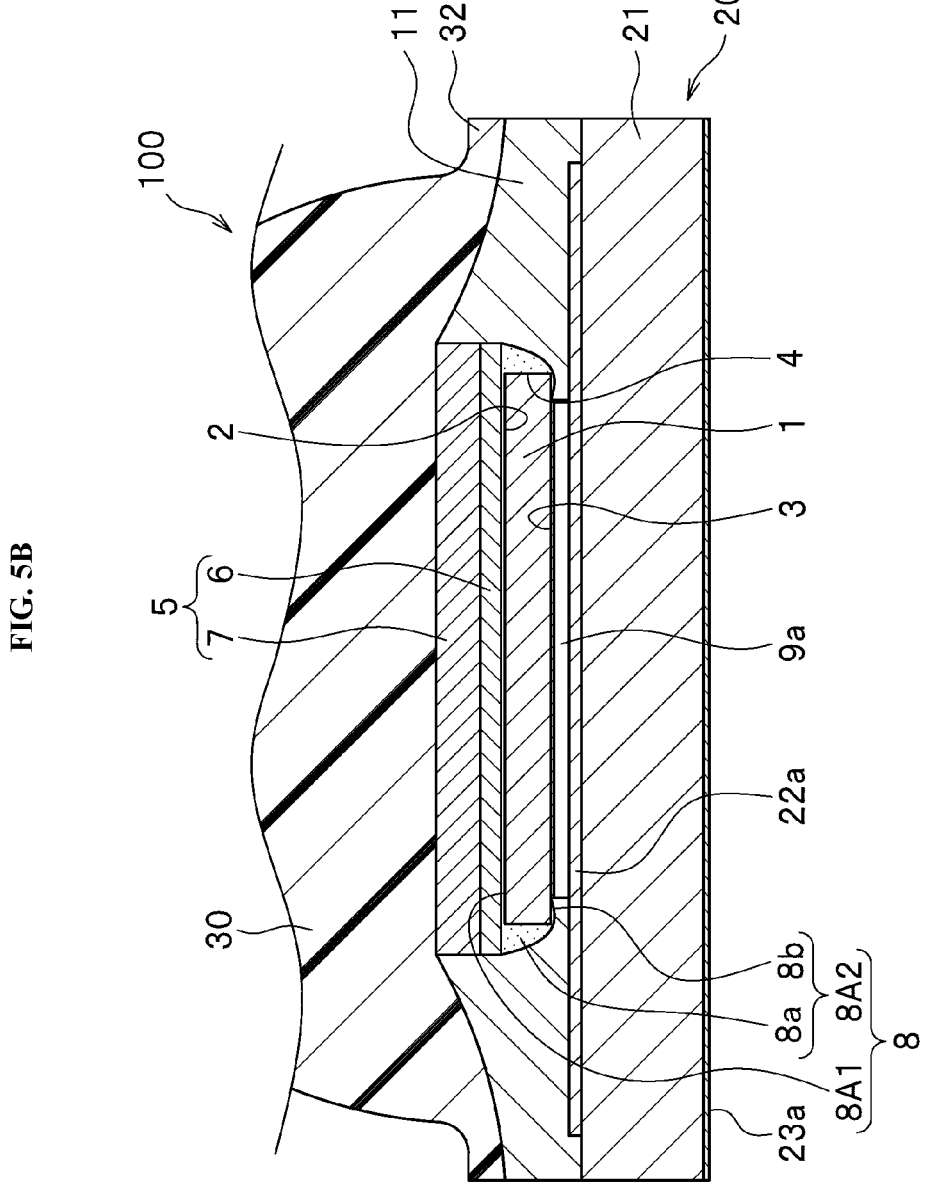
FIG. 5B is an enlarged cross-sectional view schematically illustrating, in an enlarged manner, a cross section taken along the line VB-VB in FIG. 5A.
Figure 5C:
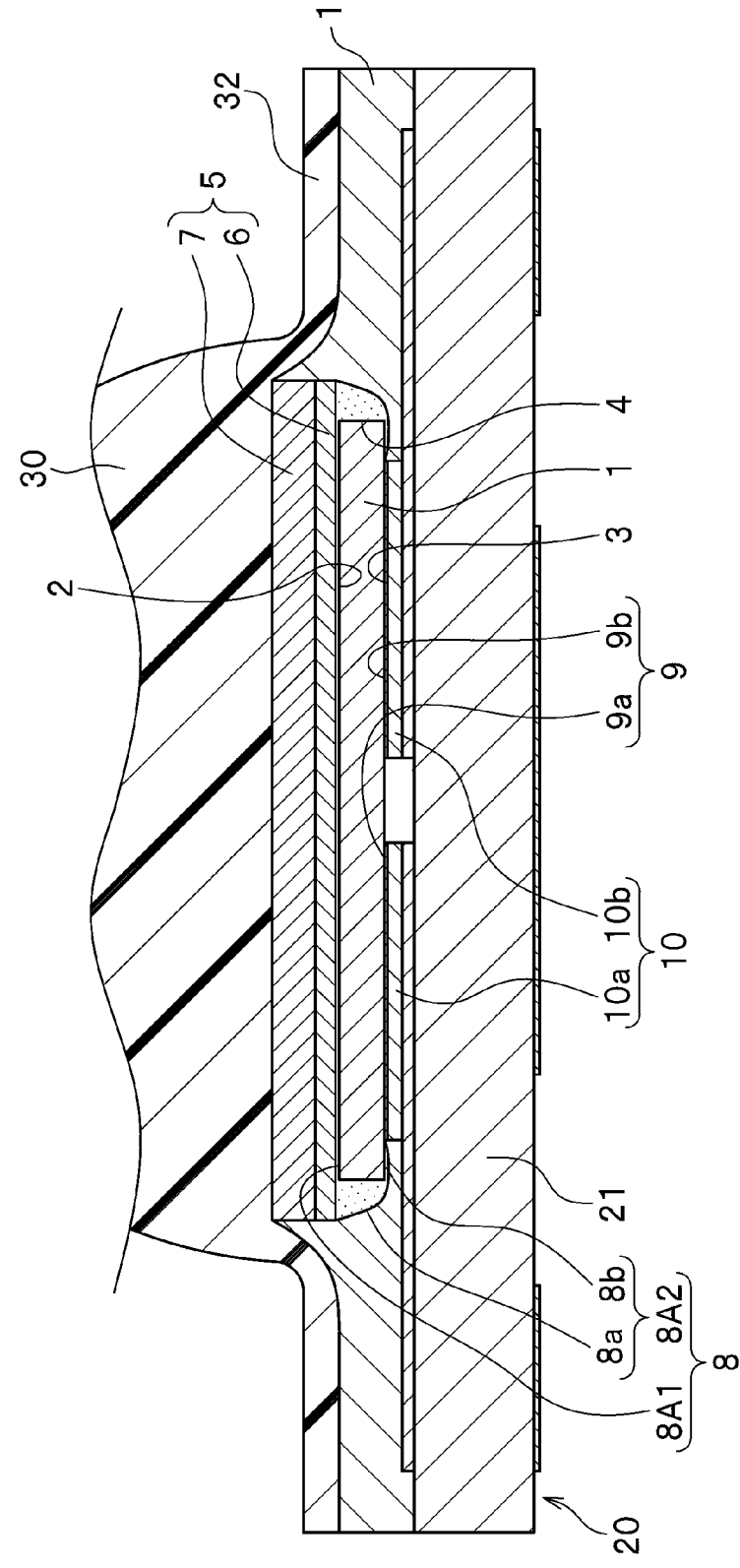
FIG. 5C is an enlarged cross-sectional view schematically illustrating, in an enlarged manner, a cross section taken along the line VC-VC in FIG. 5A.

A light-emitting device 100 will be described with reference to FIGS. 1 to 4 and FIGS. 5A to 5C. FIG. 1 is a perspective view schematically illustrating the entire light-emitting device according to a first embodiment. FIG. 2 is a cross-sectional view taken along line II-II in FIG. 1. FIG. 3 is a cross-sectional view schematically illustrating a state of a fillet in which a portion illustrated in FIG. 2 is enlarged. FIG. 4 is a schematic view schematically illustrating a positional relationship between a fillet and a metal post in the light-emitting device according to the first embodiment. FIG. 5A is a plan view schematically illustrating the light-emitting device according to the first embodiment. FIG. 5B is an enlarged cross-sectional view schematically illustrating, in an enlarged manner, a cross section taken along the line VB-VB in FIG. 5A. FIG. 5C is an enlarged cross-sectional view schematically illustrating, in an enlarged manner, a cross section taken along the line VC-VC in FIG. 5A.

As illustrated in FIGS. 1 to 4 and FIG. 5A, the light-emitting device 100 includes: a light-emitting element 1 including a first surface 2 serving as a light extracting surface, a second surface 3 disposed on an opposite side from the first surface 2, a lateral surface 4 connecting the first surface 2 and the second surface 3, and an element electrode 9 provided on the second surface 3; a substrate 20 including a wiring 22 electrically connected to the element electrode 9; a metal post 10 disposed between the element electrode 9 and the wiring 22; a transmissive member 5 that allows light from the light-emitting element 1 to pass through; and an adhesive resin 8 disposed between the first surface 2 of the light-emitting element 1 and the transmissive member 5. A portion of the adhesive resin 8 is disposed on the lateral surface 4 of the light-emitting element 1 and on a peripheral edge of the second surface 3 of the light-emitting element 1.

Description will be made on the assumption that the light-emitting device 100 further includes, as one example, a light reflective member 11 that covers an upper surface of the substrate 20, a lateral surface of the adhesive resin 8, a lateral surface of the transmissive member 5, and a lateral surface of the metal post 10, and a lens 30 is provided on an upper surface of the transmissive member 5 that faces the light-emitting element 1. Configurations of the light-emitting device 100 will be described.

Light-Emitting Element

The light-emitting element 1 is formed into, for example, a cuboid shape by the first surface 2 serving as a light extracting surface, the second surface 3 disposed on the opposite side from the first surface 2 and serving as a bottom surface, and the lateral surface 4 serving as a surface that connects the first surface 2 and the second surface 3. The light-emitting element 1 includes the element electrode 9 provided on the second surface 3. The light-emitting element 1 includes a semiconductor structural body.

The semiconductor structural body includes an n-side semiconductor layer, a p-side semiconductor layer, and an active layer interposed between the n-side semiconductor layer and the p-side semiconductor layer. The active layer may have a single quantum well (SQW) structure, or may have a multi quantum well (MQW) structure including a plurality of well layers. The semiconductor structural body includes a plurality of semiconductor layers made of a nitride semiconductor. The nitride semiconductor includes a semiconductor containing all compositions having a chemical formula of $In_xAl_yGa_{1-x-y}N$ ($0 \leq x$, $0 \leq y$, $x+y \leq 1$) provided that the composition ratios x and y are within the respective ranges. The peak wavelength of light emitted from the active layer can be selected as appropriate in accordance with the object. The active layer is configured, for example, so as to be able to emit visible light or ultraviolet light.

The semiconductor structural body may include a plurality of light emitting members each including an n-side semiconductor layer, an active layer, and a p-side semiconductor layer. In a case in which the semiconductor structural body includes a plurality of light emitting members, the plurality of light emitting members may include well layers having different peak wavelengths of emitted light or may include well layers having the same peak wavelength of emitted light. Note that the "same peak wavelength of emitted light" includes a case in which there is a variation not more than 5 nm. The combination of peak wavelengths of emitted light of the plurality of light emitting members can be selected on an as-necessary basis. For example, in a case in which the semiconductor structural body includes two light emitting members, the combinations of light emitted from each of the two light emitting members include a combination of blue light and blue light, a combination of green light and green light, a combination of red light and red light, a combination of ultraviolet light and ultraviolet light, a combination of blue light and green light, a combination of blue light and red light, or a combination of green light and red light. For example, in a case in which the semiconductor structural body includes three light emitting members, the combinations of light emitted from each of the light emitting members include a combination of blue light, green light, and red light. Each of the light emitting members may include one or more wall layers having peak wavelengths different from other well layers.

The element electrode 9 of the light-emitting element 1 includes a first element electrode 9a and a second element electrode 9b disposed on the second surface 3 so as to be spaced apart from each other. For example, the light-emitting element 1 is configured such that the metal post 10 is disposed on the element electrode 9 to create a predetermined gap or more between the second surface of the light-emitting element 1 and the substrate 20 coupled to the second surface. Note that the metal post 10 may be disposed in advance on the element electrode 9 side of the light-emitting element 1 or may be disposed in advance on the wiring 22 of the substrate 20 (see FIG. 12). Here, description will be first made for an example in which the metal post 10 is disposed on the element electrode 9.

Metal Post

The metal post 10 is disposed on the element electrode 9, and is electrically connected to the wiring 22 of the substrate 20 to electrically connect the light-emitting element and the substrate 20 to each other. The metal post 10 includes a first metal post 10a disposed on the first element electrode 9a and a second metal post 10b disposed on the second element electrode 9b.

Each of the first metal post 10a and the second metal post 10b is disposed so as to have an area equal to or greater than the area of the corresponding element electrode of first element electrode 9a and the second element electrode 9b. For example, the first metal post 10a and the second metal post 10b are disposed so as to have a flattened cuboid shape, and include four lateral surfaces each formed by a flat vertical plane. For the metal post 10, it is possible to use a metal material made of an electrically conductive metal such as Cu or Au, or an alloy of Cu or Au or the like.

For example, it is preferable that the metal post 10 be disposed such that a distance h from the upper surface of the substrate 20 to the second surface 3 of the light-emitting element 1 falls in a range of 20 μm to 110 μm. When the metal post 10 makes the distance h be equal to or greater than 20 μm, it is possible to easily place a second fillet 8b formed of a portion of the adhesive resin 8 that will be described below. In addition, when the metal post 10 makes the distance h be equal to or less than 110 μm, it is possible to easily form the second fillet 8b. This metal post 10 can be formed on the second surface 3 side of the light-emitting element 1 through printing or plating or the like.

Light-Transmissive Member

For example, the transmissive member 5 has a plate shape, and is formed into a rectangular shape in a plan view. The transmissive member 5 includes a wavelength conversion layer 6 containing a phosphor, and a light-transmissive layer 7 having transmissivity and joined to the wavelength conversion layer 6. This transmissive member 5 absorbs at least a portion of light from the light-emitting element 1, and converts the wavelength into a different wavelength. The transmissive member 5 is disposed such that the wavelength conversion layer 6 is opposed to the first surface 2 of the light-emitting element 1 with the adhesive resin 8, which will be described below, being interposed between them. In addition, the transmissive member 5 has a larger surface than the first surface 2 serving as a light extracting surface of the light-emitting element 1, and this surface is joined to the first surface 2 of the light-emitting element 1. That is, the outer edge of the transmissive member 5 is sized so as to be disposed further outward than the outer edge of the light-emitting element 1 in a plan view.

An example of a material that may be used for the wavelength conversion layer 6 includes a formed product obtained by mixing a transmissive material such as resin, glass, or an inorganic substance as a binder of the phosphor and forming. Examples of a material that may be used for the binder include an organic resin binder such as epoxy resin, silicone resin, phenolic resin, or polyimide resin, or an inorganic binder such as glass. In addition, an example of a material that may be used for the phosphor includes an yttrium-aluminum-garnet-based phosphor (YAG-based phosphor) that is a typical phosphor that can emit a white-based mixed color when suitably combined with a blue light-emitting element. Furthermore, in a case of achieving a light-emitting device 100 that can emit white light, the density of a phosphor contained in the wavelength conversion layer 6 is adjusted so as to be able to emit white light. In addition, it is preferred to set the density of the phosphor to fall, for example, in a range approximately from 5% to 50%.

In addition, a blue light-emitting element is used for the light-emitting element 1, a YAG-based phosphor is used for the phosphor, and a nitride-based phosphor having a large red color component is used. This makes it possible to emit umber light. Umber has a dominant wavelength that falls, for example, in a range of 580 nm to 600 nm.

The YAG-based phosphor is a phosphor containing Y and Al and activated with at least one element selected from rare earth metals. The YAG-based phosphor is excited by light emitted from the light-emitting element 1, and emits light. Examples of a material that may be used for the YAG-based phosphor include $(Re_{1-x}Sm_x)_3(Al_{1-y}Ga_y)_5O_{12}:Ce$ ($0 \leq x \leq 1$, $0 \leq y \leq 1$, where Re is at least one element selected from the group consisting of Y, Gd, and La).

In addition, the nitride-based phosphor is a phosphor containing: at least one or more rare earth metals selected from the group consisting of Y, La, Ce, Pr, Nd, Sm, Eu, Gd, Tb, Dy, Ho, Er, and Lu; at least one or more group 2 elements selected from the group consisting of Be, Mg, Ca, Sr, Ba, and Zn; at least one or more group 4 elements selected from the group consisting of C, Si, Ge, Sn, Ti, Zr, and Hf; and N. Note that 0 may be contained in the compositions of this nitride-based phosphor. It is preferable that the nitride-based phosphor contain at least one selected from the group consisting of a first nitride phosphor having a composition expressed as Formula (1A), and a second nitride-based phosphor having a composition expressed as Formula (1B).

$$M^1{}_2Si_5N_8:Eu \tag{1A}$$

(where $M^1$ represents at least one or more alkaline earth metal elements containing at least one selected from the group consisting of Ca, Sr, and Ba.)

$$Sr_qCa_sAl_tSi_uN_v:Eu \tag{1B}$$

(where q, s, t, u, and v satisfy $0 \leq q \leq 1$, $0 \leq s \leq 1$, $q+s \leq 1.1$, $0.9 \leq t \leq 1.1$, $0.9 \leq u \leq 1.1$, $2.5 \leq v \leq 3.5$, respectively.)

In the formulae expressing the composition of the phosphor, the characters preceding the colon (:) represent a mole ratio for elements in one mole of composition of a host crystal and a phosphor, and the characters following the colon (:) represent an activating element.

It is preferable that the phosphor contain at least one selected from the group consisting of a first fluoride phosphor expressed as the following formula (1C), and a second fluoride phosphor having compositions differing from those of the Formula (1C) and expressed as the Formula (1C').

$$A_c[M^2{}_{1-b}Mn^{4+}{}_bF_d] \tag{1C}$$

(where A includes at least one selected from the group consisting of $K^+$, $Li^+$, $Na^+$, $Rb^+$, $Cs^+$, and $NH_4^+$, and among these, $K^+$ is preferable. $M^2$ includes at least one element selected from the group consisting of group 4 elements and group 14 elements, and among these, Si and Ge are preferable. b satisfies $0 < b < 0.2$, c is an absolute value of electric charge of $[M^2{}_{1-b}Mn^{4+}{}_bF_d]$ ion, d satisfies $5 < d < 7$.)

$$A'_{c'}[M^{2'}{}_{1-b}Mn^{4+}{}_bF_{d'}] \tag{1C'}$$

(where A' contains at least one selected from the group consisting of $K^+$, $Li^+$, $Na^+$, $Rb^+$, $Cs^+$, and $NH_4^+$, and among these, $K^+$ is preferable. $M^{2'}$ contains at least one element selected from the group consisting of group 4 elements, group 13 elements, and group 14 elements, and among these, Si and Al are preferable. b' satisfies $0 < b' < 0.2$, c' is an absolute value of electric charge of $[M^{2'}{}_{1-b}Mn^{4+}{}_bF_{d'}]$ ion, and d' satisfies $5 < d' < 7$.)

The light-transmissive layer 7 is made of a transmissive material, for example, resin, glass, inorganic substance, or the like, and is formed into a plate shape. This light-transmissive layer 7 has a size equivalent to the wavelength conversion layer 6, and is disposed such that the lower surface thereof is in contact with the upper surface of the wavelength conversion layer 6. Examples of a material that may be used for the light-transmissive layer 7 include a plate-shape body made of a transmissive material such as glass or resin. In addition, examples of a material that may be used for the glass include borosilicate glass, or quartz glass. Examples of a material that may be used for the resin include silicone resin, or epoxy resin. Note that the light-transmissive layer 7 may include a light diffusion member. When the density of the phosphor of the wavelength conversion layer 6 increases, colors are more likely to be uneven. However, with the light diffusion member being included in the light-transmissive layer 7, it is possible to suppress the uneven color or the nonuniformity in brightness. Examples of a material that may be used for the light diffusion member include titanium oxide, barium titanate, aluminum oxide, or silicon oxide.

Note that description has been made by giving an example in which the transmissive member 5 includes two layers of the wavelength conversion layer 6 and the light-transmissive layer 7. However, the transmissive member 5 may be a single layer structure consisting of one layer containing a phosphor or may include two or more single layers stacked. For example, as disclosed in the JP 2018-172628 A, it is possible to use a sintered compact containing a YAG-based phosphor as the transmissive member 5. In addition, a light diffusion member may be added to the transmissive member 5 as needed. Furthermore, the thickness of the transmissive member 5 can be set so as to fall, for example, in a range of 20 μm to 100 μm, preferably in a range of 20 μm to 50 μm. In a case in which the thickness of the transmissive member 5 is greater than 100 μm, the heat dissipating property tends to reduce. In addition, as the thickness of the wavelength conversion layer 6 reduces, it is more preferable from the viewpoint of the heat dissipating property. However, if the thickness is too small, the amount of the phosphor reduces. Thus, the range of chromaticity of emitted light tends to reduce. By considering these factors, the transmissive member 5 is set to have an appropriate thickness described above.

Adhesive Resin

The adhesive resin 8 is disposed such that a portion thereof forms an adhesive layer 8A1 that causes the transmissive member 5 and the light-emitting element 1 to adhere to each other, and the other portion forms a fillet 8A2. By increasing the size of the fillet 8A2, a protruding curved line Si of the fillet expands outwardly, which makes it possible to reflect a larger amount of light to a direction toward the transmissive member 5. Thus, it is possible to improve an efficiency in extracting light of the light-emitting device 100. For the adhesive resin 8 that constitutes the fillet 8A2, it is preferable to use a transmissive material that can effectively guide light outputted from the light-emitting element 1 to the transmissive member 5 and also can optically couple the light-emitting element 1 and the transmissive member 5. Examples of a material that may be used for the adhesive resin 8 include an organic resin such as epoxy resin, silicone resin, phenolic resin, or polyimide resin, and silicone resin is preferable. Note that, as the thickness of the adhesive layer 8A1 formed between the light-emitting element 1 and the transmissive member 5 reduces, it is more preferable. This leads to an improvement in the heat dissipating property and also leads to a reduction in a loss of light that passes through the adhesive resin 8 between the light-emitting element 1 and the transmissive member 5. This improves the output of light of the light-emitting device 100.

For example, the fillet 8A2 includes a first fillet 8a disposed between a peripheral edge of the lower surface of the transmissive member 5 and a lateral surface of the light-emitting element 1, and a second fillet 8b disposed on a peripheral edge of the second surface 3 of the light-emitting element 1. The fillet 8A2 is disposed by increasing, by the metal post 10, the distance h between the second surface 3 of the light-emitting element 1 and the substrate 20 as described above so that the distance h becomes larger than that of the existing one, and thus by increasing the amount of drop of the adhesive resin 8 dropped on the first surface 2 of the light-emitting element 1 so that the volume of the first fillet 8a increases in the manufacturing steps that will be described below. In addition, a portion of the increased adhesive resin 8 is disposed such that the first fillet 8a forms a curved line S1 protruding toward the outward in a cross-sectional view. Furthermore, a portion of the adhesive resin 8 that cannot be retained in the first fillet 8a serves as the second fillet 8b, and is disposed so as to extend to the peripheral edge of the second surface 3 of the light-emitting element 1.

In particular, it is difficult to increase the volume of the first fillet 8a at four corner positions of the light-emitting element 1, as compared with the position of the lateral surface 4 of the light-emitting element 1 having a quadrangle shape in a plan view. Thus, it is necessary to increase the amount of drop of the adhesive resin 8 so as to form the protruding curved line Si at all of the corner portions and the lateral surface 4 of the light-emitting element 1 in a cross-sectional view. Then, the adhesive resin 8 is received on the peripheral edge of the second surface 3 of the light-emitting element 1 so that the adhesive resin 8 does not fall down toward the substrate 20 side due to the increase in the amount of drop.

The excessive adhesive resin 8 other than the amount of the adhesive layer 8A1 necessary to adhere to the upper surface of the light-emitting element 1 extends up to the lateral surface of the light-emitting element 1, which enables the adhesive resin 8 to form the fillet 8A2 including the first fillet 8a and the second fillet 8b. Note that the triangle shape of the first fillet 8a in cross section and the second fillet 8b can be formed by optimizing the wettability or viscosity of the silicone resin or the like relative to the lateral surface of the light-emitting element 1 or the lower surface of the transmissive member 5.

The first fillet 8a is disposed with the maximum thickness falling, for example, in a range of 35 μm to 70 μm. The thickness of the first fillet 8a reaches the maximum value at a position where the distance from the lateral surface 4 of the light-emitting element 1 to the protruding curved line S1 is the furthest in a cross-sectional view.

In addition, the second fillet 8b is disposed such that the thickness of the second fillet 8b is, preferably, equal to or less than 1/10 of the maximum value of the thickness of the first fillet 8a. Thus, the second fillet 8b is disposed so as to have a thickness in a range of 3.5 μm to 7 μm. Note that the thickness of the second fillet 8b represents the thickness obtained from the second surface 3 of the light-emitting element 1.

The second fillet 8b may have a constant thickness or may have a tapered thickness reducing toward the end in a cross-sectional view. In addition, the second fillet 8b is disposed on the peripheral edge of the second surface 3 of the light-emitting element 1, preferably in a range D1 from the outermost peripheral edge of the second surface of the light-emitting element 1 to a lateral surface of the metal post 10, as illustrated in FIG. 4.

In particular, the fillet 8A2 increases the volume of the first fillet 8a at the position of the lateral surface 4 of the light-emitting element 1 and at positions of four corners of the light-emitting element 1. This makes it possible to increase the luminous flux. Furthermore, the state of the first fillet 8a is equalized between the lateral surface 4 of the light-emitting element 1 and positions of corners. Thus, the increased luminous flux of light emitted from the light-emitting element 1 can be uniform in the fillet 8A2.

The fillet 8A2 of the adhesive resin 8 includes the second fillet 8b disposed on the second surface 3 of the light-emitting element 1 in a such a manner that a portion of the adhesive resin 8 extends around. This improves the wettability (adhesiveness) of resin included in the light reflective member 11. This may be because the adhesive resin 8 and the resin that forms the light reflective member 11 are the same resin materials, and hence, the wettability between them is better than the wettability between resin and the second surface (rear surface) 3 of the light-emitting element 1 that is a semiconductor. Thus, for example, with the existence of the fillet 8A2, it is possible to reduce the likelihood of occurrence, in the resin of the light reflective member 11, of a malfunction such as a void that reduces efficiency of reflection of the light reflective member 11.

Light Reflective Member

The light reflective member 11 covers the upper surface of the substrate 20, the lateral surface of the adhesive resin 8, the lateral surface of the transmissive member 5, and the lateral surface of the metal post 10, and is disposed so as to expose the upper surface of the transmissive member 5. This light reflective member 11 is used to reflect light from the light-emitting element 1. The light reflective member 11 enables light outputted from the light-emitting element 1 to enter the wavelength conversion layer 6 of the transmissive member 5. More specifically, in addition to the lateral surface of each of the transmissive member 5 and the first fillet 8a of the fillet 8A2, the light reflective member 11 is also disposed on the second fillet 8b and a lower surface of the light-emitting element 1. Furthermore, the light reflective member 11 is formed so as to slope gently downward from the upper end edge of the transmissive member 5 toward the outer side in a cross-sectional view, and constitutes a portion of the lateral surface of the light-emitting device 100. The light reflective member 11 is disposed such that, in a cross-sectional view, the position thereof is higher on the upper end edge side of the transmissive member 5 than on a flat portion 32 of the lens 30 that will be described below, and gradually continues to the lower end surface of the flat portion 32 of the lens.

It is preferable to use an insulating material for the light reflective member 11. Alternatively, thermosetting resin, thermoplastic resin, or the like can be used in order to secure the strength to a certain degree. The light reflective member 11 can be formed, for example, by using resin containing one or more of silicone resin, modified silicone resin, epoxy resin, modified epoxy resin, acrylic resin, phenolic resin, BT resin, and PPA, or by using hybrid resin and a light reflective member. Among these materials, it is preferable to use resin containing, as a base polymer, silicone resin exhibiting excellent heat resistance property and electrically insulating property and having flexibility. Examples of the light reflective member 11 include titanium oxide, silicon oxide, zirconium oxide, magnesium oxide, calcium carbonate, calcium hydroxide, calcium silicate, zinc oxide, barium titanate, potassium titanate, alumina, aluminum nitride, nitriding boron, or mullite. Among these materials, titanium oxide is preferable because it is relatively stable in terms of moisture or the like and has high index of refraction.

Substrate

The substrate 20 is used to mount members that constitute the light-emitting device 100. Here, the substrate 20 is configured such that the wiring (electroconductive pattern) 22 used to be electrically connected to the metal post 10 of the light-emitting element 1 is disposed on the upper surface of a base material 21, and an external coupling electrode (electroconductive pattern) 23 used to electrically connect an external power supply and the light-emitting device 100 is formed on the lower surface of the base material 21, the external coupling electrode 23 being separated into a positive electrode 23a and a negative electrode 23b that are insulated from each other. In addition, here, a heat dissipating plate 24 is disposed between the positive electrode 23a and the negative electrode 23b at the substrate 20 so as to be spaced apart from them. The substrate 20 electrically connects the wiring 22 and the external coupling electrode 23 through a via wiring or the like that is not illustrated in the drawing.

An example of the material that may be used for the base material 21 of the substrate 20 includes an insulating material that is less likely to allow light from the light-emitting element 1 or outside light to pass through, and for example, ceramic such as alumina, aluminum nitride, or LTCC, or a resin material such as phenolic resin, epoxy resin, polyimide resin, BT resin, or polyphthalamide. In addition, it is also possible to use a composite material of an insulating material and a metal member. Note that, in a case in which resin is used as a material of the base material 21 of the substrate 20, it may be possible to mix resin with an inorganic filler such as glass fiber, silicon oxide, titanium oxide, or alumina as necessary. As a result, the mechanical strength can be improved, the thermal expansion coefficient can be reduced, and the light reflectance can be improved. Note that no specific limitation is applied to the thickness of the substrate 20, and it may be possible to form the substrate so as to have any given thickness in accordance with the object and application.

Lens Portion

The lens 30 is disposed on the upper surface of the transmissive member 5. The lens 30 is formed into a plano-convex lens having a hemispherical shape with a curved surface protruding upward. The lens 30 includes a convex lens portion 31 having a hemispherical shape and a flat portion 32 continuing to the lower end of the convex lens portion 31. The lens center of this lens 30 is disposed so as to align with the element center of the light-emitting element 1. Furthermore, the flat portion 32 is formed so as to have a rectangular shape in a plan view, and is formed so as to be larger than the convex lens portion 31 and have a size substantially fitting the shape of the substrate 20 in a plan view. The flat portion 32 is disposed in the height direction so as to be lower than the upper surface of the transmissive member 5. Thus, light traveling in the horizontal direction from the upper end surface of the transmissive member 5 is delivered from a portion of the convex lens portion 31 of the lens to the outside.

The lens 30 emits light from the light-emitting element 1 to the outside of the light-emitting device 100 through the convex lens portion 31. The lens 30 can collect light from the light-emitting element 1 to the upper side, and output the collected light.

Examples of the material of the lens 30 include glass, or transmissive resin exhibiting excellent weather resistance such as epoxy resin, urea resin, or silicone resin. The lens 30 is a member having transmissivity or a transparent body. The lens 30 may contain a filler such as a diffusing member. With the lens 30 containing a filler, it is possible to reduce a change in light distribution. Examples of the filler include barium titanate, titanium oxide, aluminum oxide, or silicon oxide.

The lens 30 may contain a coloring agent. For example, the lens 30 containing a blue coloring agent can achieve a light-emitting device 100 that emits blue light, the lens 30 containing a green coloring agent can achieve a light-emitting device 100 that emits green light, and the lens 30 containing a red coloring agent can achieve a light-emitting device 100 that emits red light. By using these light-emitting devices 100, it is possible to manufacture a light source device that can provide full-color display.

Examples of the usable coloring agent include copper phthalocyanine, C.I. pigment green 36, N, N'-dimethyl-3, 4:9, 10-perylenebisdicarbimide. In addition, for the coloring agent, it is possible to use a coloring agent containing any one selected from the group consisting of a pigment and dye.

No specific limitation is applied to the pigment. However, an example of the pigment includes a pigment using an inorganic material or organic material.

Note that it is preferable to use a pigment or a dye that basically does not convert light from the light-emitting element 1 into light having a different wavelength. As described below, the reason for using this configuration is to avoid exerting an influence on a wavelength conversion member in a case in which the wavelength conversion member is included.

The lens 30 may include a light stabilizer. Examples of the light stabilizer include a benzotriazole-based, a benzophenone-based, salicylate-based, cyanoacrylate-based, or hindered amine-based light stabilizer.

Operation of Light-emitting Device

As the light-emitting device 100 is driven, an electric current is supplied from an external power source through the external coupling electrode 23 to the light-emitting element 1, and the light-emitting element 1 emits light. The wavelength of the light directed upward from the light-emitting element 1 is converted by the wavelength conversion layer 6 of the transmissive member 5, and for example, is outputted through the convex lens portion 31 to the outside as white light. In addition, as the upper end surface of the transmissive member 5 is disposed on the convex lens portion 31, the light directed in the horizontal direction from the light-emitting element 1 is outputted to the outside through the convex lens portion 31. Furthermore, since the first fillet 8a of the fillet 8A2 here is disposed such that a volume thereof is substantially equal between four sides of the lateral surface of the light-emitting element 1 and also four corner portions as illustrated in FIGS. 5A to 5C, the light from the light-emitting element 1 can have luminous flux having higher intensity, and the luminous flux of light sent through the first fillet 8a can be made substantially uniform.

Modification Example 1

Figure 6:
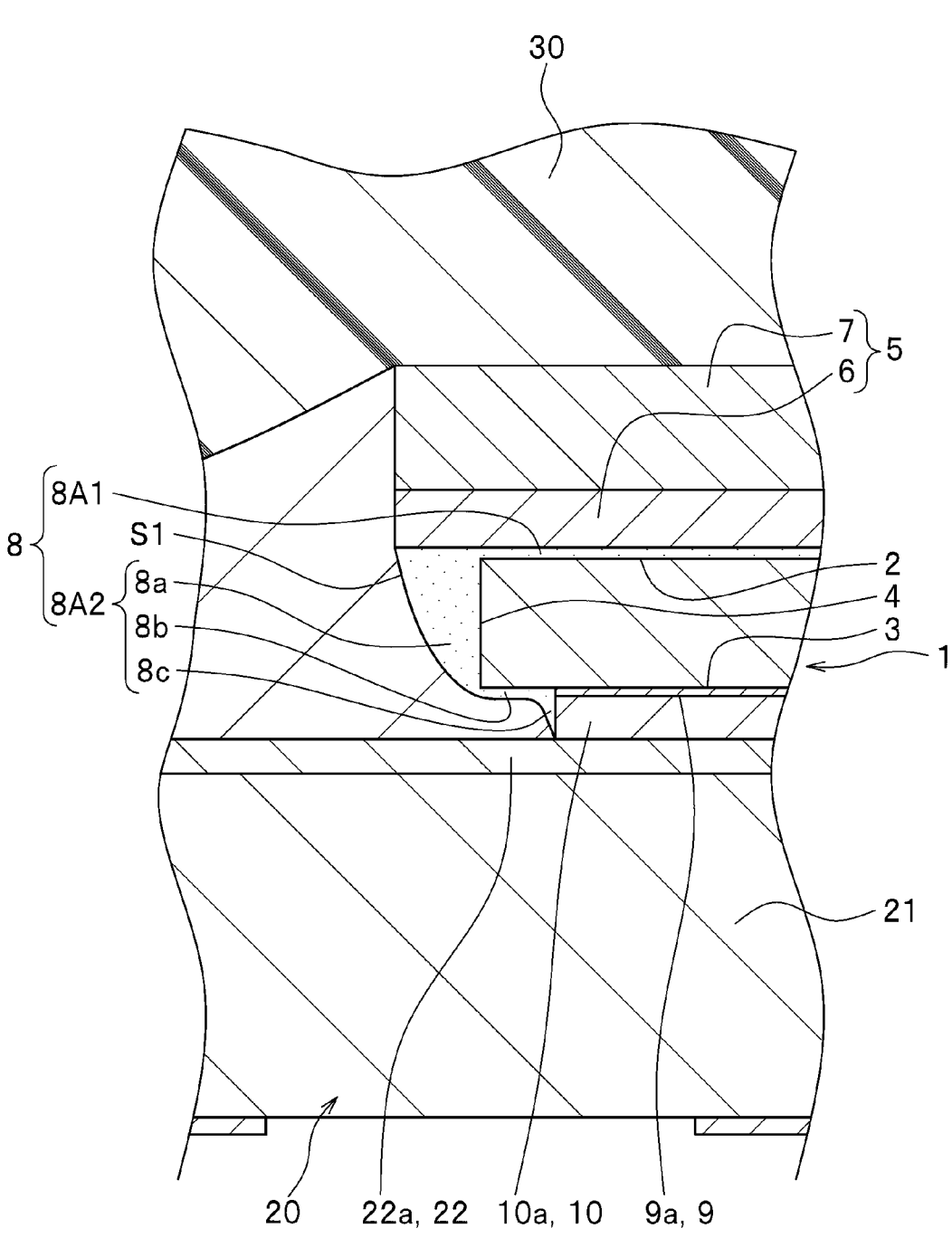
FIG. 6 is a cross-sectional view illustrating a modification example of a state of a fillet in the light-emitting device according to the first embodiment.

Next, a modification example of the fillet 8A2 will be described with reference to FIG. 6. FIG. 6 is a cross-sectional view illustrating a modification example of a state of the fillet in the light-emitting device according to the first embodiment. Note that the same reference characters are attached to the configurations that have been already described in FIGS. 1 to 4 and FIGS. 5A to 5C, and explanation thereof will not be repeated.

The adhesive resin 8 further includes a third fillet 8c disposed so as to continue from the second surface 3 of the light-emitting element 1 to a lateral surface of the metal post 10. In other words, the fillet 8A2 includes the first fillet 8a, the second fillet 8b, and the third fillet 8c. The third fillet 8c is disposed so as to continue from the second fillet 8b, and is disposed so as to cover one side of the lateral surface of the metal post 10. This third fillet 8c is disposed on lateral surfaces of the metal post 10 in three directions that constitute the outer edge side of the light-emitting element 1. That is, the lateral surfaces include lateral surfaces of the first metal post 10a in three directions and lateral surfaces of the second metal post 10b in three directions. In addition, the third fillet 8c may be disposed so as to partially or entirely cover the lateral surface of the metal post 10. Note that at the second surface 3 of the light-emitting element 1, the third fillet 8c may enter a region between the first metal post 10a and the second metal post 10b to form an extended portion of the second fillet 8b. With the third fillet 8c being disposed, a region that accepts the adhesive resin 8 expands, which makes it easy to adjust the amount of drop of the adhesive resin 8.

Modification Example 2

Figure 7:
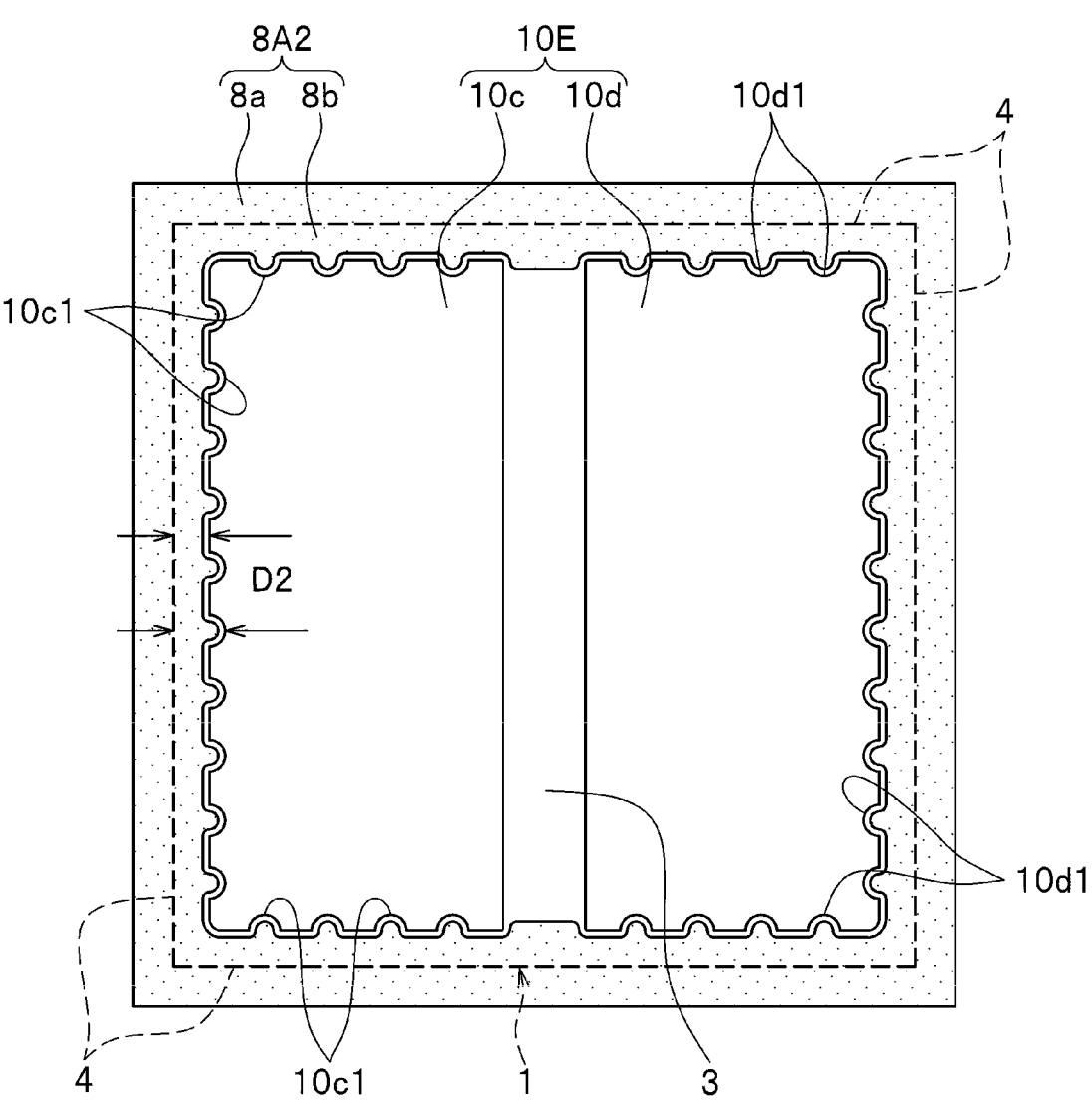
FIG. 7 is a schematic view schematically illustrating a modification example of a metal post of a light-emitting element used in the first embodiment and also illustrating a positional relationship between the fillet and the metal post.
Figure 8A:
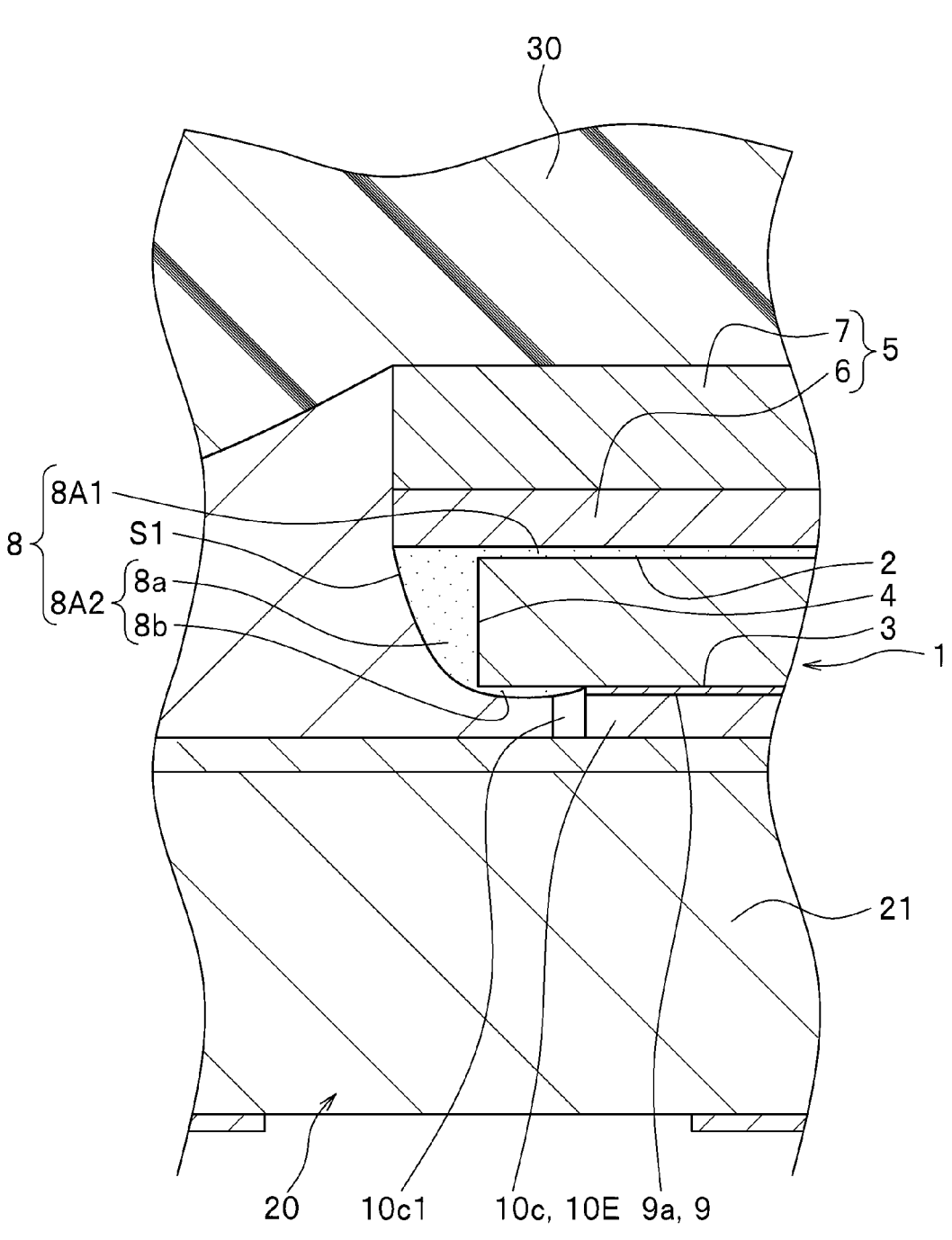
FIG. 8A is a cross-sectional view illustrating a state of the fillet on the metal post in FIG. 7.
Figures 8B, 8C:
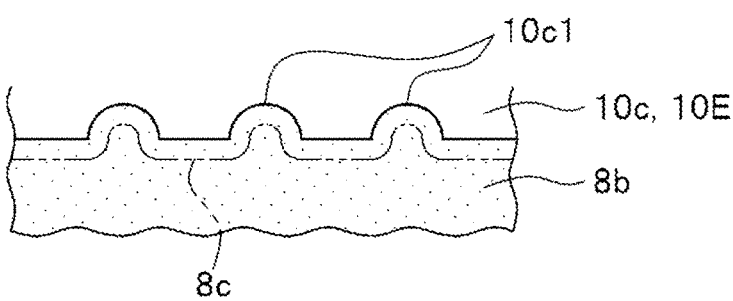
FIG. 8B is a cross-sectional view illustrating an example in which the fillet is disposed on a lateral surface of the metal post in FIG. 7.
FIG. 8C is a schematic view schematically illustrating a state of recessed portions of the metal post and the fillet in FIG. 8B.

Furthermore, a modification example of the metal post 10 will be described with reference to FIG. 7 and FIGS. 8A to 8C. FIG. 7 is a schematic view schematically illustrating a modification example of a metal post of the light-emitting element used in the first embodiment and also illustrating a positional relationship between the fillet and the metal post. FIG. 8A is a cross-sectional view illustrating a state of the fillet on the metal post in FIG. 7. FIG. 8B is a cross-sectional view illustrating an example in which the fillet is disposed on a lateral surface of the metal post in FIG. 7. FIG. 8C is a schematic view schematically illustrating a state of recessed portions of the metal post and the fillet in FIG. 8B. Note that the same reference characters are attached to the configurations that have been described above, and explanation thereof will not be repeated.

In a metal post 10E, a recessed portion 10c1 is formed on lateral surfaces of the first metal post 10c in three directions, and a recessed portion 10d1 is formed on lateral surfaces of the second metal post 10d in three directions. This recessed portion 10c1 is formed into a hemisphere shape in cross section, and is provided at constant intervals on the lateral surface of the metal post 10E. Thus, the second fillet 8b of the fillet 8A2 can be disposed in a region D2 extending from the outermost peripheral edge of the second surface 3 of the light-emitting element 1 to a lateral surface of the metal post 10E, extending into the recessed portions 10c1, and extending into the recessed portions 10d1, as illustrated in FIG. 7.

Third Modification Example

In addition, the fillet 8A2 may be configured such that the third fillet 8c disposed on a lateral surface of the metal post 10E continues from the second fillet 8b, as illustrated in FIGS. 8B and 8C.

With the metal post 10E including the recessed portions 10c1 and 10d1 on lateral surfaces of the metal post 10E, it is possible to increase the amount of the adhesive resin 8 that can be accommodated, which makes it easy to increase the cross section of the first fillet 8a.

Manufacturing Method for Light-emitting Device

Figure 9:
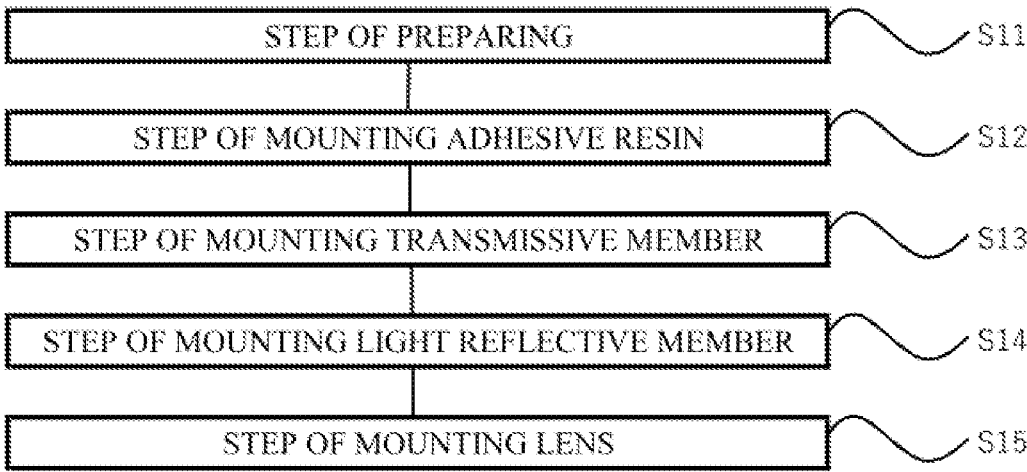
FIG. 9 is a flowchart illustrating a method of manufacturing the light-emitting device according to the first embodiment.

Next, a method of manufacturing a light-emitting device will be described with reference to FIG. 9. FIG. 9 is a flowchart illustrating an example of a method of manufacturing a light-emitting device.

The method for manufacturing a light-emitting device 100 includes: a step S11 (step of preparing) of preparing a light-emitting element mounted substrate by preparing a light-emitting element including a first surface serving as a light extracting surface, a second surface disposed on an opposite side from the first surface, a lateral surface connecting the first surface and the second surface, and an element electrode disposed on the second surface, and preparing a substrate, the light-emitting element mounted substrate having the element electrode of the light-emitting element and the substrate electrically joined through a metal post; a step S12 (step of mounting an adhesive resin) of mounting an adhesive resin at the first surface serving as the light extracting surface of the light-emitting element; a step S13 (step of mounting a transmissive member) of mounting a transmissive member on the adhesive resin; and a step S14 (step of mounting a light reflective member) of mounting a light reflective member that directly or indirectly covers the substrate and the light-emitting element. In addition, the step S13 of mounting the transmissive member includes mounting the adhesive resin on a portion between the first surface of the light-emitting element and the transmissive member, the lateral surface of the light-emitting element, and a peripheral edge of the second surface of the light-emitting element. Note that the method of manufacturing a light-emitting device is described such that, after the step S14 of mounting the light reflective member, a step S15 (step of mounting a lens) of mounting a lens having a curved surface protruding upward at an upper surface of the transmissive member is further performed.

Step of Preparing

Figure 12:
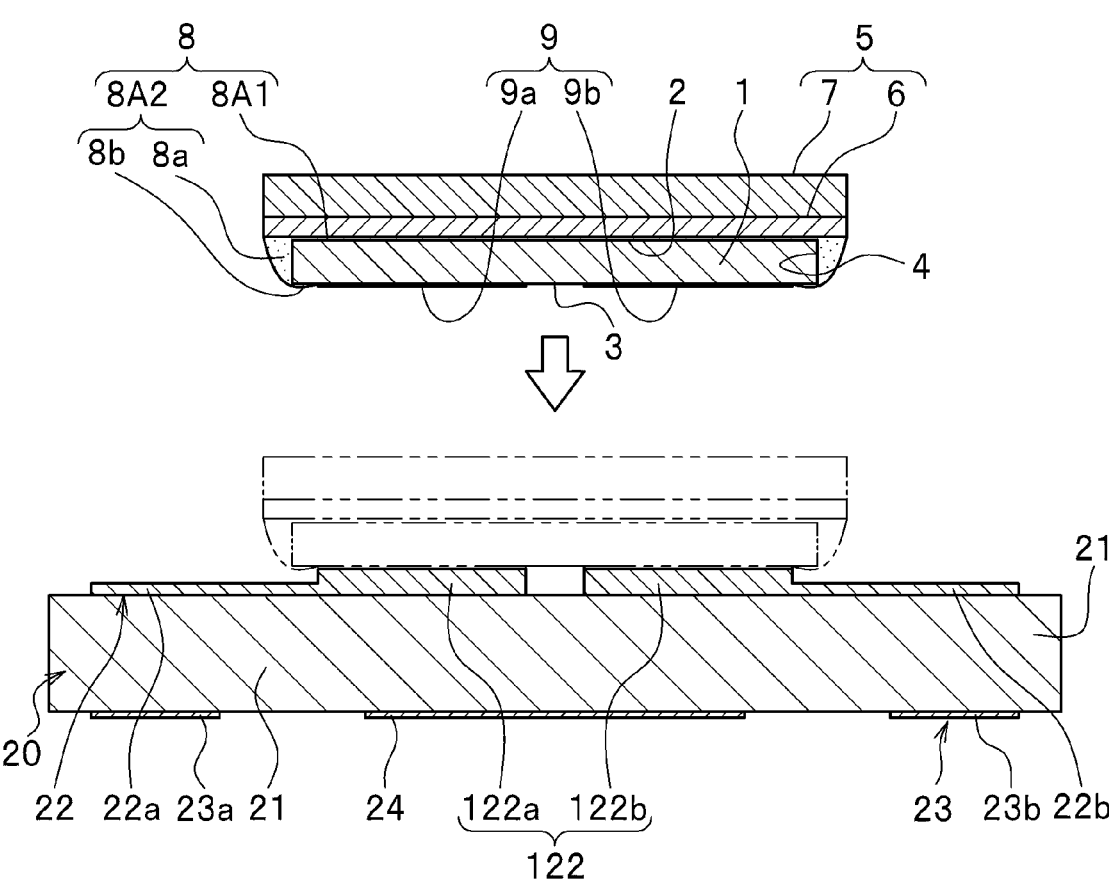
FIG. 12 is a schematic view schematically illustrating a modification example of a metal post.

The step S11 is a step of preparing a light-emitting element mounted substrate by preparing the light-emitting element 1 including the first surface 2 serving as a light extracting surface, the second surface 3 disposed on an opposite side from the first surface 2, the lateral surface 4 connecting the first surface 2 and the second surface 3, and the element electrode 9 disposed on the second surface 3, and preparing the substrate 20. The light-emitting element mounted substrate has the element electrode 9 of the light-emitting element 1 and the substrate 20 electrically joined through a metal post 10. In the preparing step S11, the metal post 10 is mounted on the element electrode of the light-emitting element 1 in a range of 20 μm to 110 μm for example, by applying plating or screen printing. The light-emitting element 1 used here includes the element electrode 9 provided on the second surface 3 that is to be a rear surface, and has a rectangular shape in a plan view. The substrate 20 includes a via wiring extending in a thickness direction. The substrate 20 includes an upper surface provided with the wiring 22 coupled to the light-emitting element 1, and a lower surface provided with the external coupling electrode 23 and the heat dissipating plate 24. In addition, the metal post 10 of the light-emitting element 1 is coupled to the wiring 22 of the substrate 20 through an electrically conductive adhesive member to prepare a light-emitting element mounted substrate. For example, the light-emitting element mounted substrate includes a region to which a plurality of light-emitting elements 1 are coupled, and that allows light-emitting devices 100 to be separated into single pieces. At the light-emitting element mounted substrate, light-emitting elements 1 are in a state of being arrayed in row and column indirections at predetermined intervals. Furthermore, description will be made on the assumption that the metal post 10 is disposed in advance on the element electrode 9 of the light-emitting element 1. However, as illustrated in FIG. 12 that will be described below, it may be possible to employ a configuration in which a metal post 122 is disposed on a portion of the wiring 22 of the substrate 21.

Step of Mounting Adhesive Resin

The step S12 of mounting an adhesive resin is a step of mounting the adhesive resin 8 on the first surface 2 serving as a light extracting surface of the light-emitting element 1. In the step S12, an appropriate amount of the adhesive resin 8 is dropped by a supplying device including a nozzle, onto the first surface 2 of the light-emitting element 1 of the light-emitting element mounted substrate. Note that the nozzle of the supplying device moves in the row and column directions to drop the adhesive resin 8 onto the first surface 2 of the light-emitting element 1. Alternatively, the light-emitting element mounted substrate disposed on the mounting table is moved by a movement mechanism provided at the mounting table side, and the adhesive resin 8 is dropped onto the first surface 2 of each of the plurality of light-emitting elements 1 arrayed in the row and column directions. Note that the viscosity of and the amount of drop of the adhesive resin 8 to be dropped is set in advance. For example, the amount of drop of the adhesive resin 8 is the amount with which, at four sides and four corner portions of the light-emitting element 1, the first fillet 8a of the fillet 8A2 forms the curved line S1 protruding toward the outside in a cross-sectional view, and is also the amount that does not cause the adhesive resin 8 to fall and drop on the substrate due to the second fillet 8b or the third fillet 8c being disposed. Furthermore, in the step S12, in order to facilitate the first fillet 8a at the corner portion of the light-emitting element 1 being equivalent to the lateral surface 4 of the light-emitting element 1 in a cross-sectional view, it is preferable that the adhesive resin that has been dropped onto the first surface of the light-emitting element 1 be disposed along the diagonal line of the light-emitting element and a portion of the appropriate adhesive resin 8 be disposed at positions closer to the four corner portions of the light-emitting element 1.

Step of Mounting Transmissive Member

The step S13 of mounting the transmissive member is a step of mounting the transmissive member 5 on the adhesive resin 8. In the step 13, it is preferable to use the transmissive member 5 in a state in which the light-transmissive layer 7 and the wavelength conversion layer 6 are joined to each other in advance. Note that, by applying a wavelength conversion member containing a phosphor to a sheet-shaped member having transmissivity through a printing method to form the light-transmissive layer 7 and the wavelength conversion layer 6, and separating them into single pieces, the transmissive member 5 is formed into a size so as to be disposed on the first surface 2 of the light-emitting element 1. In the step S13, the transmissive member 5 is picked up by using a handler or the like to be mounted one by one on the first surface 2 of the light-emitting element 1 in a state of being pressed at a predetermined pressure, and then, is dried. After this, through this step S13, the transmissive member 5 is mounted, and the adhesive layer 8A1 is disposed using the adhesive resin 8 between the lower surface of the transmissive member 5 and the first surface 2 of the light-emitting element 1. The adhesive resin 8 is formed such that the first fillet 8a is disposed so as to be coupled to the peripheral edge of the lower surface of the transmissive member 5 and the lateral surface 4 of the light-emitting element 1, and the second fillet 8b is disposed on the peripheral edge of the second surface 3 of the light-emitting element 1 so as to continue to the first fillet 8a. In addition, with this step S13, the first fillet 8a is formed such that the outer edge of the fillet forms the curved line S1 protruding toward the outer side in a cross-sectional view. Note that the first fillet 8a can be disposed in a state where the cross section area is substantially equal at the position of the lateral surface 4 of the light-emitting element 1 and the position of the corner of the light-emitting element 1.

Step of Mounting Light Reflective Member

The step S14 of mounting the light reflective member is a step of mounting the light reflective member 11 that directly or indirectly covers the substrate 20 and the light-emitting element 1. In the step S14, for example, at the upper side of the substrate 20 that has been fixed, resin or the like that constitutes the light reflective member 11 is fed such that the upper surface of the transmissive member 5 is exposed, by using a resin discharging device that can move in the vertical direction, the horizontal direction, or the like relative to the substrate 20.

Step of Mounting Lens

The step S15 of mounting a lens is a step of mounting the lens 30 having a curved surface protruding upward on the upper surface of the transmissive member 5. In this step S15, the lower surface of the flat portion 32 of the lens 30 is bonded to the upper surface of the transmissive member 5 through an adhesive having transmissivity. Note that, after the end of this step S15, a separating step is performed to perform cutting for each lens 30, and the light-emitting device 100 is manufactured.

In the method of manufacturing a light-emitting device 100, the light-emitting element 1 and the transmissive member 5 are bonded using the adhesive resin 8 with the adhesive layer 8A1 being interposed between the light-emitting element 1 and the transmissive member 5, and the fillet 8A2 including the first fillet and the second fillet is disposed on the lateral surface 4 and the second surface 3 of the light-emitting element 1. This makes it possible to increase the cross-sectional area of the first fillet in such a manner that the outer edge of the fillet has the protruding curved line S1 in a cross-sectional view of the first fillet. Thus, it is possible to provide the light-emitting device 100 that makes it possible to improve the luminous flux.

Note that, in the step S13 of mounting the transmissive member, the fillet 8A2 may include the first fillet 8a, the second fillet 8b, and the third fillet 8c, as illustrated in FIG. 6. With the adhesive resin 8 being allowed to include the fillet 8A2 and the third fillet 8c, it is possible to increase the degree of freedom in terms of adjustment of the viscosity.

Second Embodiment

Figure 10:
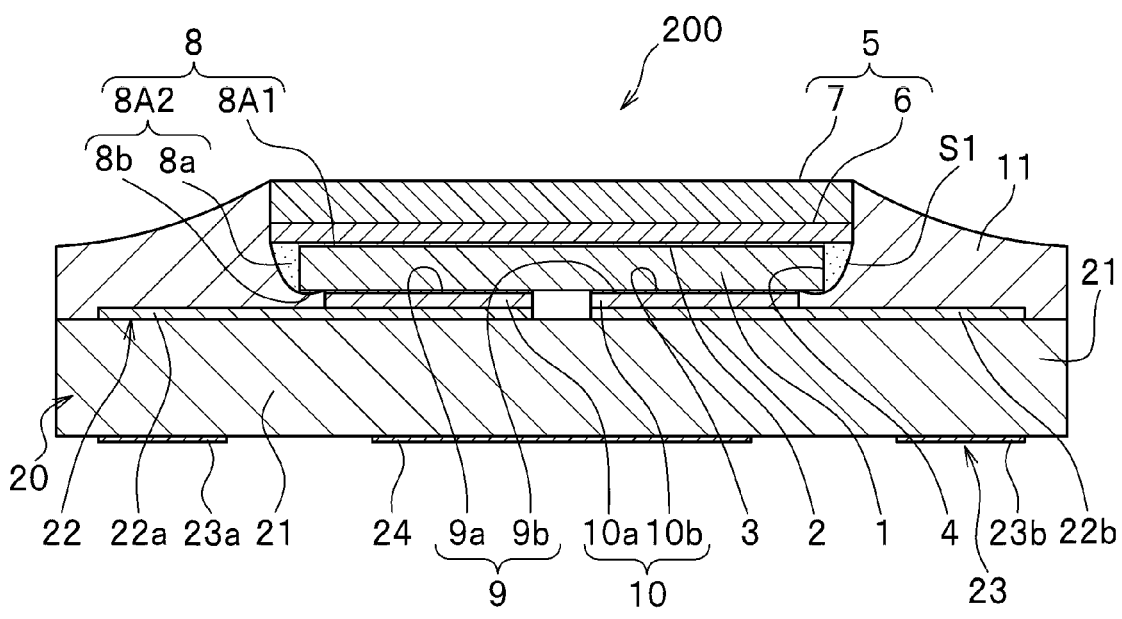
FIG. 10 is a cross-sectional view schematically illustrating a light-emitting device according to a second embodiment.

Next, a light-emitting device 200 according to a second embodiment will be described with reference to FIG. 10. FIG. 10 is a cross-sectional view schematically illustrating a light-emitting device according to the second embodiment. Note that the same reference characters are attached to the configurations that have been described above, and explanation thereof will not be repeated as appropriate.

The light-emitting device 200 does not include the lens 30, as compared with the configuration of the light-emitting device 100 according to the first embodiment. This light-emitting device 200 includes: the light-emitting element 1 including the first surface 2 serving as a light extracting surface, the second surface 3 disposed on the opposite side from the first surface 2, the lateral surface 4 connecting the first surface 2 and the second surface 3, and the element electrode 9 disposed on the second surface 3; the metal post 10 disposed on the element electrode 9; the substrate 20 including the wiring 22 coupled to the metal post 10; the transmissive member 5 that allows light from the light-emitting element 1 to pass through; and the adhesive resin 8 disposed between the first surface 2 of the light-emitting element 1 and the transmissive member 5. In addition, a portion of the adhesive resin 8 is disposed on the lateral surface 4 of the light-emitting element 1 and the peripheral edge of the second surface 3 of the light-emitting element 1.

Furthermore, the adhesive resin 8 forms the adhesive layer 8A1 disposed between the first surface 2 of the light-emitting element 1 and the lower surface (the lower surface of the wavelength conversion layer 6) of the transmissive member 5, and the fillet 8A2 disposed on the light-emitting element 1 side. In addition, the fillet 8A2 includes the first fillet 8a disposed in a space between the peripheral edge of the lower surface of the transmissive member 5 and the lateral surface 4 of the light-emitting element 1, and the second fillet 8b disposed on the peripheral edge of the second surface 3 of the light-emitting element 1 so as to continue to the first fillet 8a. Note that the fillet 8A2 may be configured such that the third fillet 8c is disposed on the lateral surface of the metal post 10, 10E.

The light-emitting device 200 can be used as a light source device or the like that does not use the lens 30.

Note that, in the method of manufacturing the light-emitting device 200, the steps S11 to S14 that have been described above are performed, and then, a step of separation into pieces is performed. This makes it possible to perform manufacturing.

As described above, with the light-emitting device 100, 200, it is possible to increase the cross-sectional area of the fillet 8A2. Thus, it is possible to improve the luminous flux. Note that the first fillet 8a of the fillet 8A2 in the light-emitting device 100, 200 is configured such that, at the portion of the corner of the light-emitting element 1 and the portion of the lateral surface 4, the outer edge of the fillet has the curved line S1 protruding toward the outer side in a cross-sectional view. However, the outer edge of the fillet may have a state, for example, as illustrated in FIGS. 11A to 11D. FIGS. 11A to 11D are cross-sectional views each illustrating a modification example of the fillet.

Figure 11A:
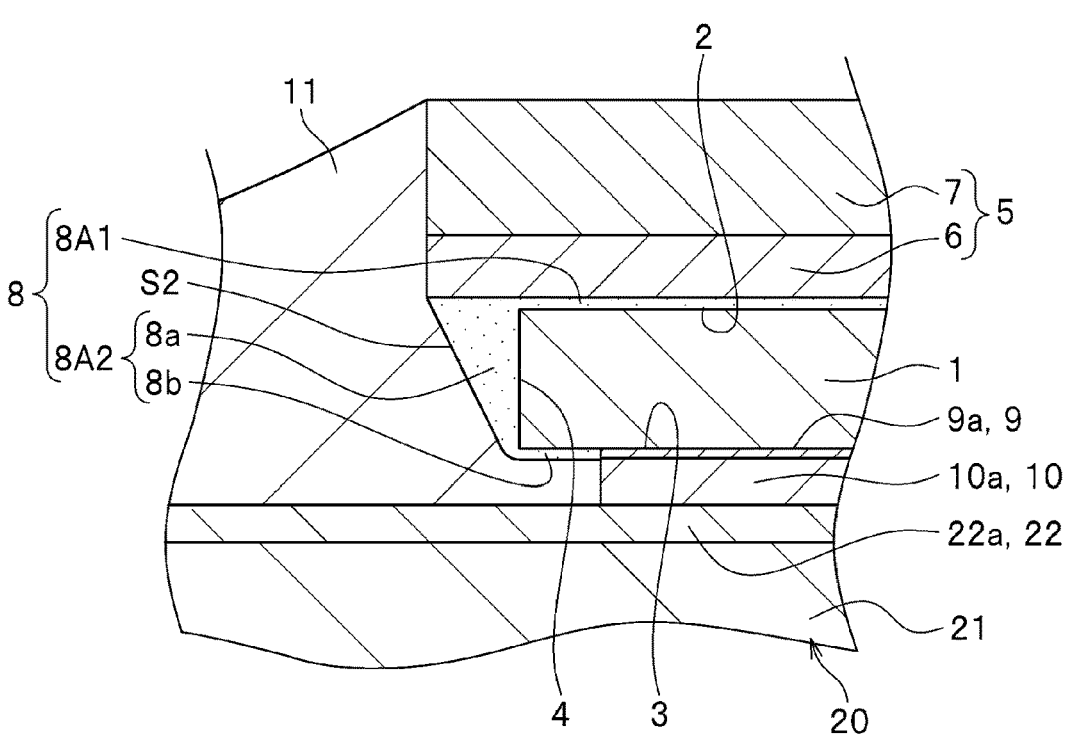
FIG. 11A is a cross-sectional view illustrating a modification example of a fillet.
Figure 11B:
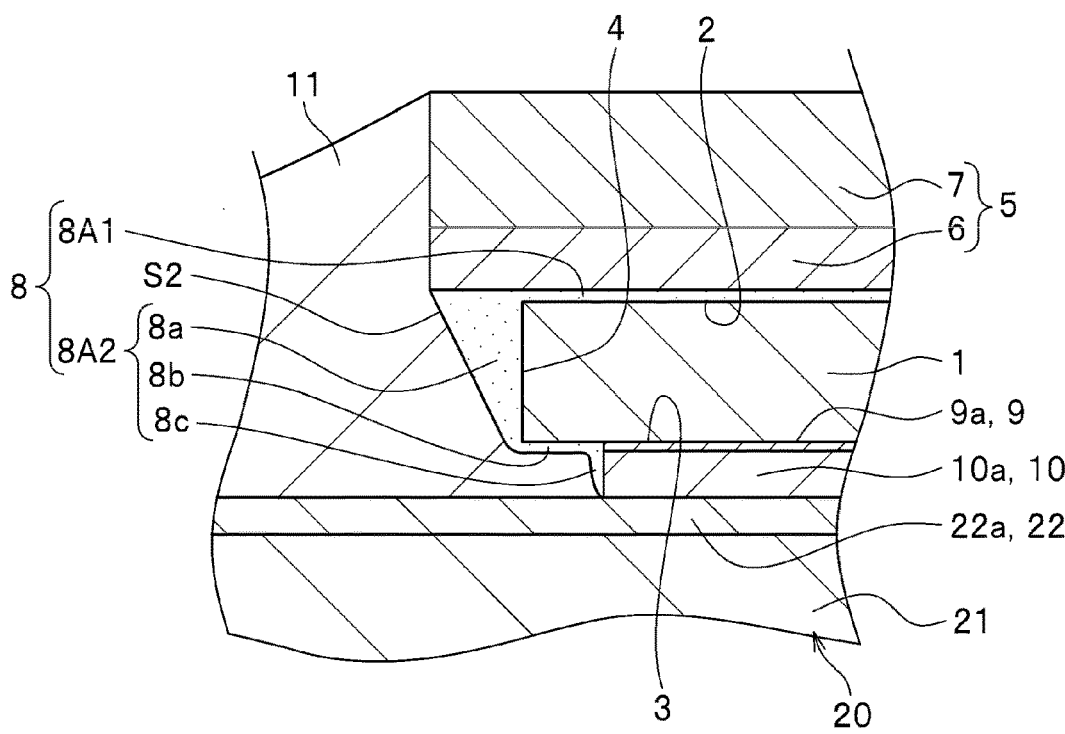
FIG. 11B is a cross-sectional view illustrating a modification example of a fillet.
Figure 11C:
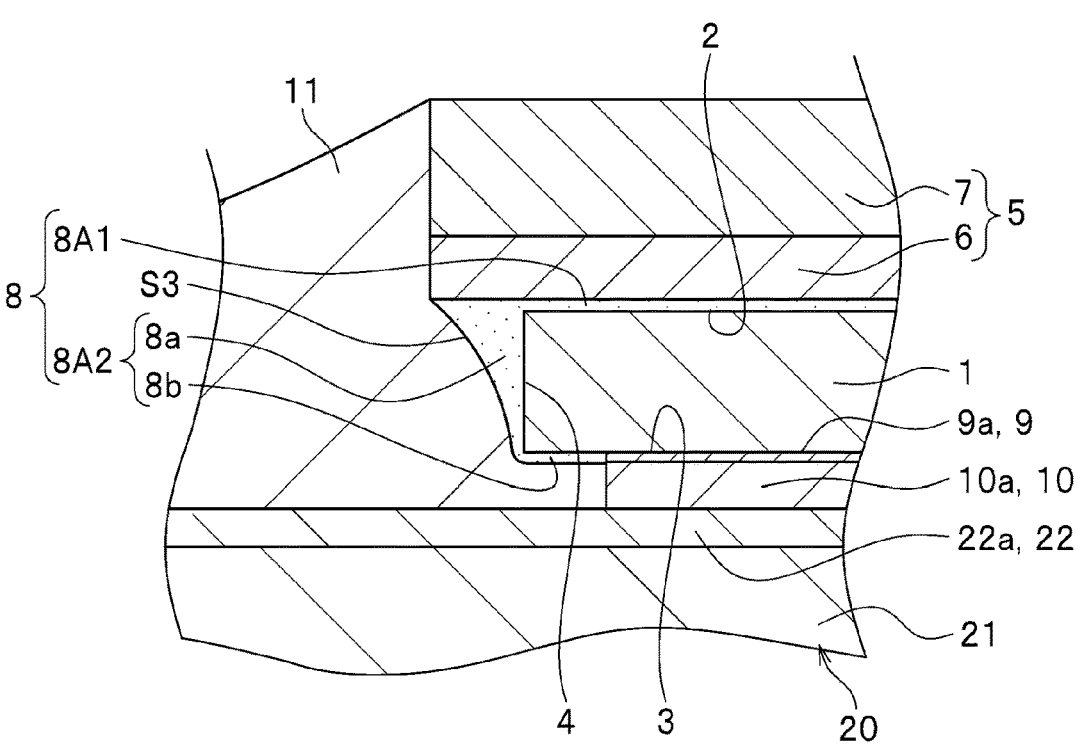
FIG. 11C is a cross-sectional view illustrating a modification example of a fillet.
Figure 11D:
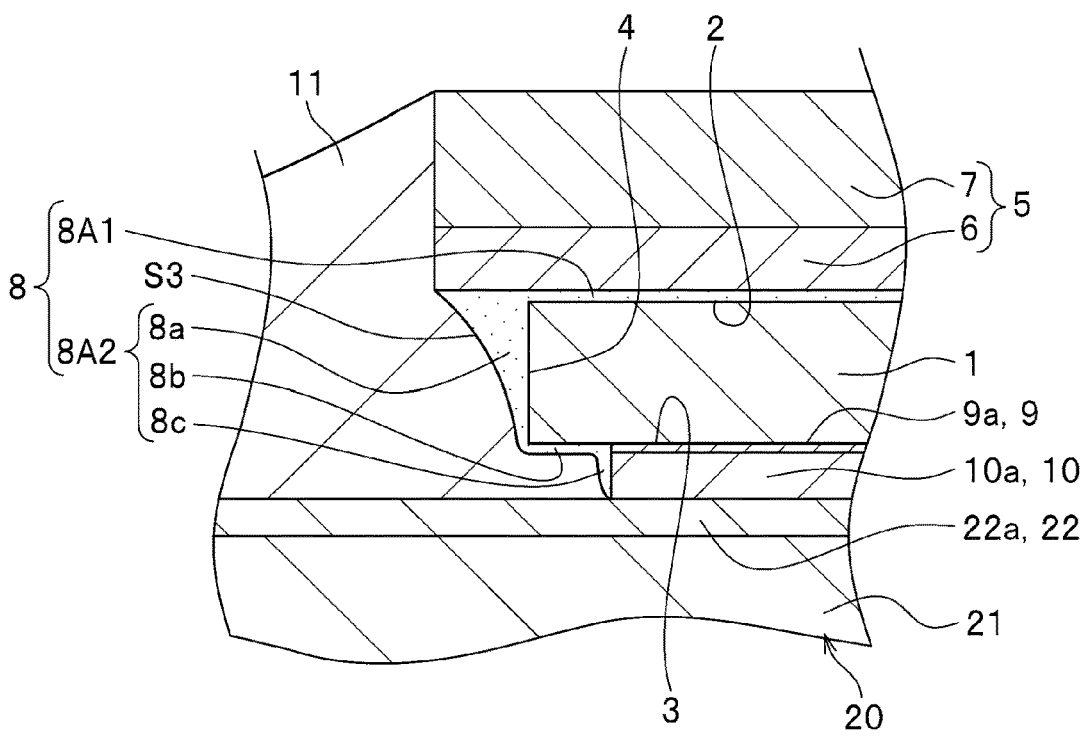
FIG. 11D is a cross-sectional view illustrating a modification example of a fillet.

The viscosity or the like of the adhesive resin 8 may be restricted due to the component. Even if the viscosity is low, it is possible to make the cross-sectional area of the fillet 8A2 larger than the existing fillet in a state in which the viscosity is low. Thus, as illustrated in FIGS. 11A and 11B, the fillet 8A2 may be configured such that the outer edge of the fillet of the first fillet 8a has a straight line S2 in a cross-sectional view, and the state is substantially equal at the position of the lateral surface 4 and the light-emitting element 1 and the positions of corners. In addition, as illustrated in FIGS. 11C and 11D, the fillet 8A2 may be configured such that the outer edge of the fillet of the first fillet 8a has a curved line S3 recessed toward the inner side in a cross-sectional view, and the state is substantially equal at the position of the lateral surface 4 of the light-emitting element 1 and the positions of corners. In any of these cases, with the first fillet 8a including the second fillet 8b or the third fillet 8c, the first fillet 8a is able to make the cross-sectional area of the fillet 8A2 larger than the existing one regardless of the state of the component of the adhesive resin 8. Note that FIGS. 11A to 11D have been described such that the metal post has the configuration illustrated in FIG. 4.

However, the state of the metal post may be in a state illustrated in FIG. 7 or may have a configuration of the fillet 8A2 in FIGS. 11A to 11D.

In addition, as illustrated in FIG. 12, the metal post 122 may be disposed on a portion of the wiring 22. The metal post 122 includes a first metal post 122a disposed on a portion of the first wiring 22a and a second metal post 122b disposed on a portion of the second wiring 22b. In addition, it is preferable that the metal post 122 be made of the same material as the wiring 22. The metal post 122 can be disposed on the base material 21 by applying plating or the like to the wiring 22. Note that it is preferable to join the metal post 122 and the element electrode 9 of the light-emitting element 1 using a joining member such as solder. As with the metal post 10 that has been described above, the metal post 122 is disposed such that a distance from the upper surface of the substrate 20 to the second surface 3 of the light-emitting element 1 falls in a range of 20 μm to 110 μm. In addition, the metal post 122 may include a recessed portion as illustrated in FIG. 7. Note that, in a case in which the metal post 122 is disposed on a portion of the wiring 22, the fillet 8A2 includes the first fillet 8a and the second fillet 8b.

INDUSTRIAL APPLICABILITY

The light-emitting device and the light source device according to the present disclosure can be preferably used for an outdoor display. In addition, the light-emitting device and the light source device according to the present disclosure can be used for a backlight light source of a liquid crystal display, various illumination fixtures, an indoor display, various display devices such as advertisement or destination information sign, or the like.

The invention claimed is:

1. A light-emitting device comprising:
a light-emitting element having an upper surface serving as a light extracting surface, a lower surface located on a side opposite the upper surface, and a lateral surface connecting the upper surface and the lower surface, wherein the light-emitting element comprises an element electrode located at the lower surface;
a substrate comprising a wiring electrically connected to the element electrode;
a metal post located between the element electrode and the wiring;
a transmissive member configured to allow light from the light-emitting element to pass therethrough; and
an adhesive resin located between the upper surface of the light-emitting element and the transmissive member, wherein:
a portion of the adhesive resin is located on the lateral surface of the light-emitting element and on a peripheral area of the lower surface of the light-emitting element,
an outer edge of the transmissive member is sized so as to be located outward of an outer edge of the light-emitting element in a plan view, and
the adhesive resin forms a curved line protruding outward in a cross-sectional view at a lower surface of the transmissive member and the lateral surface of the light-emitting element, and is located so as to continue from the lateral surface of the light-emitting element to the peripheral area of the lower surface of the light-emitting element.

2. The light-emitting device according to claim 1, wherein:

the adhesive resin is further located so as to continue from the lower surface of the light-emitting element to a lateral surface of the metal post.

3. The light-emitting device according to claim 1, wherein:
in a plan view, a lateral surface of the metal post extends along and is spaced from the lateral surface of the light-emitting element, and
at least a portion of the lateral surface of the metal post includes a recessed portion.

4. The light-emitting device according to claim 3, wherein:
the element electrode is a first element electrode,
the light-emitting element further comprises a second element electrode located at the lower surface,
the metal post includes a first metal post located between the first element electrode and the wiring, and a second metal post located between the second element electrode and the wiring, and
the recessed portion is located on a lateral surface of the first metal post that is at an outer edge side of the light-emitting element and a lateral surface of the second metal post that is at an outer edge side of the light-emitting element.

5. The light-emitting device according to claim 3, wherein:
the recessed portion is one of a plurality of recessed portions provided on the lateral surface of the metal post.

6. The light-emitting device according to claim 1, wherein:
a distance between the lower surface of the light-emitting element and the substrate is in a range of 20 μm to 110 μm.

7. The light-emitting device according to claim 1, wherein:
the transmissive member includes a wavelength conversion layer containing a phosphor, and a light-transmissive layer having transmissivity, and
the wavelength conversion layer faces the upper surface of the light-emitting element.

8. The light-emitting device according to claim 1, wherein:
the light-emitting device further includes a light reflective member that covers an upper surface of the substrate, a lateral surface of the adhesive resin, a lateral surface of the transmissive member, and a lateral surface of the metal post, and
the light reflective member is located such that an upper surface of the transmissive member is exposed.

9. The light-emitting device according to claim 8, wherein:
the light-emitting device further comprises a lens having a curved surface protruding upward and located on the upper surface of the transmissive member.

10. The light-emitting device according to claim 1, wherein:
on the lower surface of the light-emitting element, the adhesive resin is located so as to have a thickness, in a vertical direction parallel to a thickness direction of the light-emitting element, equal to or less than 1/10 of a maximum value of a length, in the vertical direction, of the lateral surface of the light-emitting element.

11. A method of manufacturing a light-emitting device, the method comprising steps of:
preparing a light-emitting element mounted substrate that comprises:

a light-emitting element having an upper surface serving as a light extracting surface, a lower surface located on a side opposite the upper surface, and a lateral surface connecting the upper surface and the lower surface, wherein the light-emitting element comprises an element electrode located on the lower surface, and a substrate, wherein the element electrode and the substrate are electrically joined through a metal post;

depositing an adhesive resin on the upper surface of the light-emitting element;

mounting a transmissive member on the adhesive resin; and forming a light reflective member that directly or indirectly covers the substrate and the light-emitting element, wherein:

in the step of mounting the transmissive member, the adhesive resin is located between the upper surface of the light-emitting element and the transmissive member, on the lateral surface of the light-emitting element, and on a peripheral area of the lower surface of the light-emitting element, in the step of preparing the light-emitting element mounted substrate, the metal post includes a recessed portion on at least a portion of a lateral surface of the metal post, and in the step of mounting the transmissive member, the adhesive resin is located at a position that enters the recessed portion of the metal post so as to continue from the peripheral area of the lower surface of the light-emitting element or at the lateral surface of the metal post so as to continue from the peripheral area of the lower surface of the light-emitting element.

12. The method of manufacturing a light-emitting device according to claim 11, further comprising:

after the step of forming the light reflective member, mounting a lens having a curved surface protruding upward on an upper surface of the transmissive member.

13. The method of manufacturing a light-emitting device according to claim 11, wherein:

in the step of preparing the light-emitting element mounted substrate, a distance between the lower surface of the light-emitting element and the substrate is in a range of 20 μm to 110 μm.

14. The method according to claim 11, wherein:

the step of preparing the light-emitting element mounted substrate comprises forming the metal post on the element electrode before electrically joining the element electrode and the substrate through the metal post.

15. The method according to claim 11, wherein:

the step of preparing the light-emitting element mounted substrate comprises forming the metal post on the wiring before electrically joining the element electrode and the substrate through the metal post.

16. A light-emitting device comprising:

a light-emitting element having an upper surface serving as a light extracting surface, a lower surface located on a side opposite the upper surface, and a lateral surface connecting the upper surface and the lower surface, wherein the light-emitting element comprises an element electrode located at the lower surface;

a substrate comprising a wiring electrically connected to the element electrode;

a metal post located between the element electrode and the wiring;

a transmissive member configured to allow light from the light-emitting element to pass therethrough; and an adhesive resin located between the upper surface of the light-emitting element and the transmissive member, wherein:

a portion of the adhesive resin is located on the lateral surface of the light-emitting element and on a peripheral area of the lower surface of the light-emitting element, and the adhesive resin is further located so as to continue from the lower surface of the light-emitting element to a lateral surface of the metal post.

\* \* \* \* \*